United States Patent
Hishida et al.

(10) Patent No.: US 11,698,586 B2
(45) Date of Patent: Jul. 11, 2023

(54) NEGATIVE-WORKING ULTRA THICK FILM PHOTORESIST

(71) Applicant: Merck Patent GmbH, Darmstadt (DE)

(72) Inventors: Aritaka Hishida, Shizuoka (JP);
Hisashi Motobayashi, Shizuoka (JP);
Lei Lu, Shizuoka (JP); Chunwei Chen, Whitehouse Station, NJ (US);
PingHung Lu, Bridgewater, NJ (US);
Weihong Liu, Branchburg, NJ (US)

(73) Assignee: Merck Patent GmbH, Darmstadt (DE)

( * ) Notice: Subject to any disclaimer, the term of this patent is extended or adjusted under 35 U.S.C. 154(b) by 0 days.

(21) Appl. No.: 16/966,998

(22) PCT Filed: Mar. 20, 2019

(86) PCT No.: PCT/EP2019/056911
§ 371 (c)(1),
(2) Date: Aug. 3, 2020

(87) PCT Pub. No.: WO2019/180058
PCT Pub. Date: Sep. 26, 2019

(65) Prior Publication Data
US 2020/0393758 A1    Dec. 17, 2020

Related U.S. Application Data

(60) Provisional application No. 62/646,946, filed on Mar. 23, 2018.

(51) Int. Cl.
G03F 7/029 (2006.01)
G03F 7/004 (2006.01)
G03F 7/031 (2006.01)

(52) U.S. Cl.
CPC ............ G03F 7/029 (2013.01); G03F 7/0045 (2013.01); G03F 7/031 (2013.01)

(58) Field of Classification Search
CPC ........ G03F 7/0045; G03F 7/028; G03F 7/032; G03F 7/161
See application file for complete search history.

(56) References Cited

U.S. PATENT DOCUMENTS 4,591,626 A * 5/1986 Kawai ...................... C08F 20/18
                                                        526/282
5,340,686 A * 8/1994 Sakaguchi ............ G03F 7/0236
                                                        430/191
(Continued)

FOREIGN PATENT DOCUMENTS

EP    0264908 A2    4/1988
EP    0833203 A1    4/1998
(Continued)

OTHER PUBLICATIONS

English translation of JP02105155. (Year: 1990).*
(Continued)

*Primary Examiner* — Cynthia H Kelly
*Assistant Examiner* — Anna Malloy
(74) *Attorney, Agent, or Firm* — Francis M. Houlihan

(57) ABSTRACT

A negative working, aqueous base developable, photosensitive photoresist composition and a process of using this composition to produce lithographic images, where this composition is one comprising: a) a polymer containing the four repeat units of structures (1), (2), (3), and (4), but no other types of repeat units; wherein v, x, y and z, respectively, represent the mole % of each repeat units of structures (1), (2), (3) and (4); b) a radical photo-initiator component, which is comprised of at least one radical photo initiator which is activated by a broad absorption of radiation from about 360 nm to about 440 nm; c) a crosslinker component which is either a mixture consisting of crosslinkers of structure (5), (6) and (7), or a single crosslinker of structure (8); d) a radical inhibitor component; e) an optional surfactant component; f) an optional dissolution promoter component; and g) a solvent. The invention also relates to the process of using this negative resist to produce lithographic images.

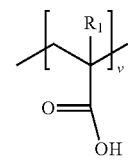

(1)

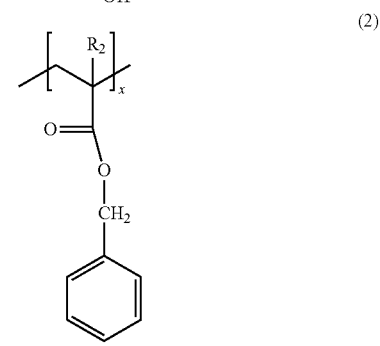

(2)

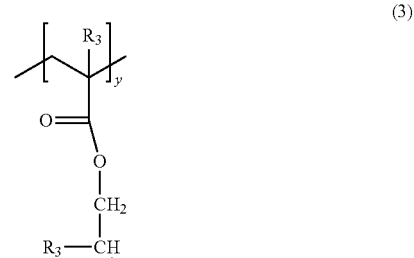

(3)

and (Continued)

-continued (4)

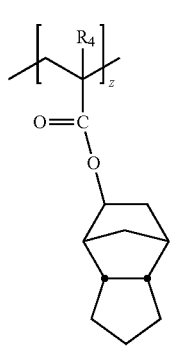

(5)

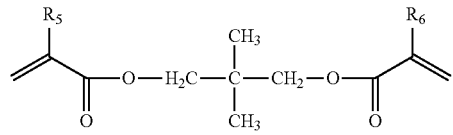

(6)

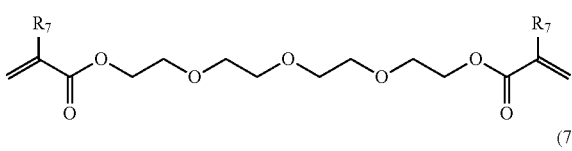

(7)

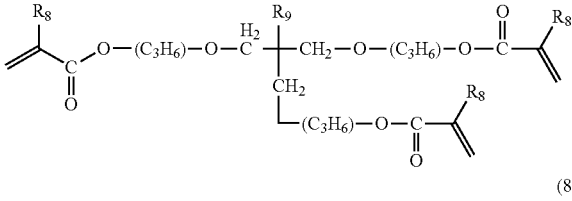

(8)

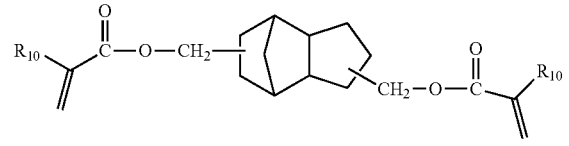

22 Claims, No Drawings

(56) References Cited

U.S. PATENT DOCUMENTS

| | | | | |
|---|---|---|---|---|
| 5,456,995 | A | * | 10/1995 | Ozaki ................ G03F 7/0226 430/165 |
| 6,296,984 | B1 | | 10/2001 | Gabor et al. |
| 8,092,981 | B2 | | 1/2012 | Kang et al. |
| 8,906,594 | B2 | | 12/2014 | Chen et al. |
| 2009/0176337 | A1 | | 7/2009 | Kang et al. |
| 2012/0088194 | A1 | * | 4/2012 | Tsubaki ................ G03F 7/16 430/319 |
| 2013/0337381 | A1 | * | 12/2013 | Chen ................ G03F 7/027 430/285.1 |
| 2016/0139507 | A1 | | 5/2016 | Kim et al. |
| 2016/0161847 | A1 | | 6/2016 | Araki et al. |
| 2018/0259850 | A1 | * | 9/2018 | Irie ................ C09B 23/146 |

FOREIGN PATENT DOCUMENTS

| | | | |
|---|---|---|---|
| EP | 2861638 A1 | | 4/2015 |
| JP | S60-90204 A | | 5/1985 |
| JP | S60-99111 A | | 6/1985 |
| JP | S61-73705 A | | 4/1986 |
| JP | 02105155 A | * | 4/1990 |
| JP | H02-275955 A | | 11/1990 |
| JP | 2008-309878 A | | 12/2008 |
| JP | 2009-003366 A | | 1/2009 |
| JP | 2010-145719 A | | 7/2010 |
| JP | 2010-286796 A | | 12/2010 |
| JP | 2013097260 A | * | 5/2013 |
| JP | 2015-516526 A | | 6/2015 |
| JP | 2015-521752 A | | 7/2015 |
| JP | 2015-193758 A | | 11/2015 |
| JP | 2016-117799 A | | 6/2016 |
| JP | 2018-151489 A | | 9/2018 |
| KR | 2015-0112560 A | | 10/2015 |
| KR | 10-2016-0118865 A | | 10/2016 |
| TW | 201407286 A | | 2/2014 |
| TW | 201506546 A | | 2/2015 |
| TW | 201627764 A | | 8/2016 |
| TW | 201631386 A | | 9/2016 |
| WO | 2005/054951 A2 | | 6/2005 |
| WO | 2013/173471 A1 | | 11/2013 |
| WO | 2013/185990 A1 | | 12/2013 |
| WO | 2014/125884 A1 | | 8/2014 |
| WO | 2016/084694 A1 | | 6/2016 |
| WO | 2019/180058 A1 | | 9/2019 |

OTHER PUBLICATIONS

English translation of JP2013097260. (Year: 2013).*
International Preliminary Report on Patentability received for PCT Patent Application No. PCT/EP2019/056911, dated Oct. 8, 2020, 9 pages.
International Search Report and Written Opinion received for International Patent Application No. PCT/EP2019/056911, dated Jun. 21, 2019, 10 pages.
Office Action received for Taiwanese Patent Application No. 108109926 dated Mar. 1, 2023, 8 Pages (3 Pages of English Translation and 5 Pages of Official copy).

* cited by examiner

NEGATIVE-WORKING ULTRA THICK FILM PHOTORESIST

This application is a United States National Stage Patent Application under 35 U.S.C. § 371 of International Patent Application No. PCT/EP2019/056911, filed Mar. 20, 2019, which claims priority to U.S. Provisional Patent Application No. 62/646,946, filed Mar. 23, 2018, the contents of each of which are being hereby incorporated herein by reference.

FIELD OF INVENTION

Disclosed are negative-working photosensitive photoresist compositions for thick film applications as well as methods of making thick film negative relief images. The relief images prepared from these compositions and methods can be used in the formation of metal bumps and posts useful for electronic interlayer interconnections. They can also be used as templates for electrochemical deposition of metal wiring patterns. These photofabrication methods have found utility in such application as chip scale packaging, microelectronic machine systems, high density interconnections, liquid crystal devices, organic transistors, light emitting diode, displays and the like.

BACKGROUND

The manufacture of many electronic components can often only easily be achieved with the use of thick film photosensitive photoresist materials, compositions and methods. The process involves coating a desired substrate with a photosensitive photoresist composition and drying followed by exposing the photoresist to actinic radiation through a photomask which contains the desired pattern of line traces, bump holes and other structures. In the case of a negative photoresist the exposed areas are hardened, while the unexposed areas are removed by a suitable developing solution, generally aqueous based. In many photofabrication processes the thickness of the coated and dried photoresist is required to be 30 microns while the line traces, bump holes and other structures have dimension that can be at least 15 microns. Once the line traces, bumps and other structures are fabricated the photoresist is removed in a stripping process again typically using solvent based solutions.

Current negative working photosensitive photoresist compositions used in thick film photofabrication processes are based on poly-hydroxy-styrene-co-acrylic acid (PSA) compositions. Acrylated monomers and photosensitive free radical initiators are also present in the photoresist which crosslink when exposed to actinic radiation. When the photoresist is exposed to actinic radiation, free radicals are generated which cause the acrylate monomers to crosslink creating a polymerized network around the PSA polymer. When a sufficiently crosslinked network is created the areas exposed to actinic radiation will be insoluble in the developing solution while the unexposed areas are solubilized and removed leaving behind a pattern of relief structures on a substrate. Processes involving electroplating deposit metals such as gold, copper, nickel, tin, and solder into the structures. Removal of the exposed photoresist by stripping solutions results in the desired metal structures.

As the thickness of the negative working photosensitive photoresist increases it becomes more difficult to fully cure the photoresist such that the bottom of the photoresist, nearest the substrate, is less cured than the top of the photoresist, which can result in undercutting of the photoresist and underplating when electroplated. Attempts to improve the bottom cure include adding acrylate monomers which have 3 or more acrylate substitutions as well as increasing the quantity of free radical initiators and increasing the time to photo-cure the photoresist, a process that can over-cure the top to the photoresist. Moreover, current PSA polymers are known to be free radical inhibitors which reduce the effectiveness of the photo-generated free radicals which reduces their ability to fully cure the photoresist. Thus, because PSA polymers are major components in these current negative resist formulations, it can act as a very strong inhibitors component, and may result in photoresist in surface rounding of lithographic features, wherein the line acuity or definition of the top of the traces or holes are dissolved away and when electroplated this results in lines which are not square or rectangular in cross-section. Also, these current PSA, also because of this large radical inhibiting effect, will result in lines which are not completely uniform resulting in metal lines which are wavy and not straight or show only a slight reentrant profile. Metal lines, posts and bumps which are not uniform result in non-uniform electric signals.

Another problem, is erosion of features in exposed areas during aqueous base development.

Another problem, is adhesion loss during development or other processing such as electroplating.

Additionally, relief structures from negative working photosensitive photoresists which are poorly cured can result in incompatibility of the photoresist with the electroplating solution as some organic materials may be extracted into the solution causing limited electroplating bath life.

When negative working photosensitive photoresists are cured it is often difficult to remove them after processing in a stripping step. Typically stripping is performed using aqueous alkaline solutions. Often not all the photoresist is removed, especially in high aspect ratio, high density applications, and that cured photoresist that is removed is often gelatinous, of solid pieces which can redeposit or clog lines and other issues.

Thus, there is a need for a negative work photosensitive photoresist which is fully cured at fast speed, has non-rounded profiles, does not undergo thickness loss in exposed areas during aqueous development, does not show adhesion loss during lithographic processing, is compatible with electroplating solutions, is free of free radical quenching materials, is easily stripped, does not show erosion of features during development and does not crack during plasma de-scum processing.

Current materials and methods centered around negative resist image-able with broad-band or other long UV radiation (a.k.a. >300 nm) are limited in achieving images with good resolution and process latitude for high aspect ratio features, such as pillars, particularly in resist pattern designed for copper plating. These current materials and methods also do not have good strip-ability after processing of the patterned thick films, needed to achieve the, aforementioned, high aspect ratios and further are not resistant to cracking during plasma descum processing while still maintaining good resistance to thickness loss during aqueous base development, and resistance to adhesion loss during lithographic process. Therefore, materials and methods are required to achieve a negative imaging resist with good resolution with high aspect ratios, good strip-ability, resistance to thickness loss, adhesion loss, and are also compatibility with electroplating and resistance to cracking during plasma de-scum processing. Specifically, while maintaining these properties, it would be especially advantageous to provide such materials which can be coated as ultra-thick films a.k.a. 20 to about 500 microns, especially, from about 80 to about 300 microns. The present disclosure addresses this need.

SUMMARY OF THE INVENTION

It has surprisingly been found that negative working photosensitive photoresists based on a novel composition containing can be used to provide, after broad-band imagining, lithographic images which have resistance to erosion of images during development, show resistance to adhesion loss during lithographic processing and also show a high compatibility with electroplating solution particularly for Cu plating applications on high pillars, are easily stripped and do not show cracking during plasma de-scum processing. These novel compositions can be coated on a substrate to produced imaginable coating wherein the film thicknesses on the substrate of these coatings can range from 5 to 400 microns. Moreover, ultra-thick coatings (e.g. 80-300 microns) from these novel compositions may be produced by a double or triple coating process while maintaining good negative lithographic performance characterized by good resolution at high aspect ratios higher than 4, and also has good strip-ability (a.k.a. patterned resist is stripped at 70° C. after 30-90 minutes using a conventional stripper such as RBV-788C (Vision Link Corp).

In a first embodiment, disclosed and claimed herein are negative working photosensitive photoresist compositions photoresist composition comprised of the following: a) a polymer containing the four repeat units of structures (1), (2), (3), and (4), but no other types of repeat units

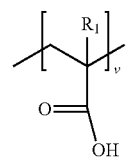

(1)

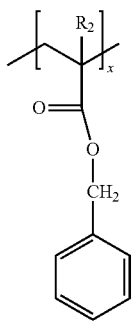

(2)

(3)

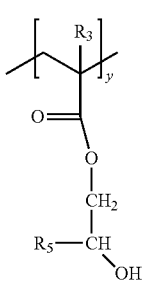

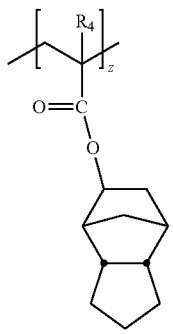

(4)

wherein v, x, y and z, respectively, represent the mole % of each repeat units of structures (1), (2), (3) and (4) in the polymer, and further wherein v ranges from about 20 to about 40 mole %, x ranges from about 20 to about 60 mole %, y ranges from about 5 to about 20 mole %, z ranges from about 3 to about 20 mole % and, further wherein $R_1$, $R_2$, $R_3$, and $R_4$, are independently selected from the group consisting of H and $CH_3$, and $R_5$ is a $C_1$ to $C_4$ alkyl moiety, and further still, wherein the summation of the mole % v, x, y and z, must add up to 100 mole %;

b) a radical photo-initiator component, which is comprised of at least one radical photo initiator which is activated by a broad absorption of radiation from about 360 nm to about 440 nm, and further wherein the wt. ratio of total wt. of said crosslinker component c) over total wt. of said radical photo-initiator component which is activated by a broad absorption of radiation from about 360 nm to about 440 nm in radical photo-initiator component b) is from about 9 to about 40;

c) a crosslinker component consisting either of a mixture of crosslinkers of structure (5), (6) and (7), or a single crosslinker of structure (8) wherein, $R_6$, $R_7$, $R_8$, $R_{10}$ are independently selected from H or Methyl, and $R_9$ is selected from Methyl or Ethyl, and further wherein the wt. ratio of total wt. of said crosslinker component c) mixture to total wt. of said polymer a), ranges from about 0.71 up to about 1.2;

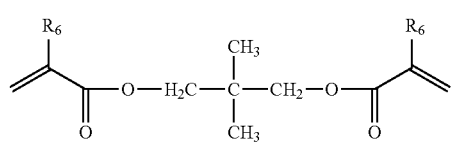

(5)

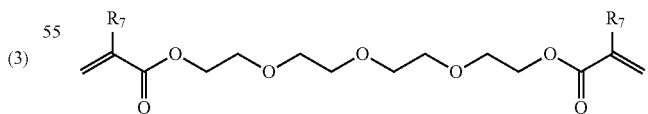

(6)

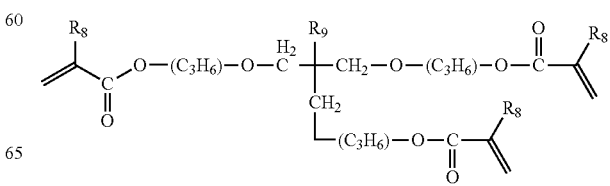

(7)

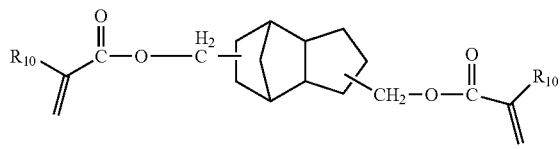
(8)

d) a radical inhibitor component, containing at least one radical inhibitor;
e) an optional surfactant component, containing at least one surfactant material;
f) an optional dissolution promoter component; and
g) a solvent;
and further wherein the novel composition is free of colorants, pigments, lake pigments, organic particles, inorganic particles, metal oxide particles, metal particles, composite oxide particles, metal sulfide particles, metal nitride particles, metal acid nitride particles, inorganic salt particles, organic salt particles, colloidal particles, fibers, oxiranes, oxiranes based crosslinkers, polysiloxane polymers.

In a second aspect embodiment, disclosed and claimed herein are methods of forming negative relief images comprising forming a negative working photosensitive photoresist layer by applying a negative working photosensitive photoresist composition of the above embodiments to a substrate and drying, image-wise exposing the photosensitive layer to actinic radiation to form a latent image, and, developing the unexposed areas in a developer, wherein the image-wise exposed photosensitive layer is optionally thermally treated.

In a third embodiment, disclosed and claimed herein are methods of the above embodiment wherein the negative working photosensitive photoresist layer in the widest aspect of this embodiment is one ranging in thickness from about 5 microns to about 40 microns. Other aspects of this embodiment are to target Ultra-thick applications ranging from about 40 to about 500 microns, especially, from about 80 to about 300 microns.

DETAILED DESCRIPTION

It is to be understood that both the foregoing general description and the following detailed description are illustrative and explanatory, and are not restrictive of the subject matter, as claimed. In this application, the use of the singular includes the plural, the word "a" or "an" means "at least one", and the use of "or" means "and/or", unless specifically stated otherwise. Furthermore, the use of the term "including", as well as other forms such as "includes" and "included", is not limiting. Also, terms such as "element" or "component" encompass both elements and components comprising one unit and elements or components that comprise more than one unit, unless specifically stated otherwise. As used herein, the conjunction "and" is intended to be inclusive and the conjunction "or" is not intended to be exclusive unless otherwise indicated. For example, the phrase "or, alternatively" is intended to be exclusive. As used herein, the term "and/or" refers to any combination of the foregoing elements including using a single element.

The section headings used herein are for organizational purposes only and are not to be construed as limiting the subject matter described. All documents, or portions of documents, cited in this application, including, but not limited to, patents, patent applications, articles, books, and treatises, are hereby expressly incorporated herein by reference in their entirety for any purpose. In the event that one or more of the incorporated literature and similar materials defines a term in a manner that contradicts the definition of that term in this application, this application controls.

As used herein, the conjunction "and" is intended to be inclusive and the conjunction "or" is not intended to be exclusive unless otherwise indicated. For example, the phrase "or, alternatively" is intended to be exclusive.

As used herein the terms "photocure" and "photopolymerize" are used interchangeably and refer to free radical initiated curing or polymerization.

As used herein the terms "radical photo-initiator," "photo-initiator," and "photo-radical initiator," are synonymous, moreover, these terms also cover any other compounds that generate reactive radicals photochemically, that can initiate radical induced polymerization, or crosslinking, of (meth) acrylic, styrenic and other reactive olefinic moieties, such other compounds include certain photo-acid generators which apart from generating an acid moiety upon irradiation with light (UV, visible), also generate concurrently such reactive radicals.

As used herein the term "broad band radiation," is radiation within the range of about 360 nm to about 440 nm.

As used herein the term "dried" refers to films with less than 5% solvent remaining after the drying process.

As used herein, the term "repeat unit" refers to a polymer repeat unit derived from a monomer.

As used herein, it is understood that a repeat unit within a polymer may be referred to by its corresponding monomer. For example, acrylate monomer (I) corresponds to its polymer repeat unit (II).

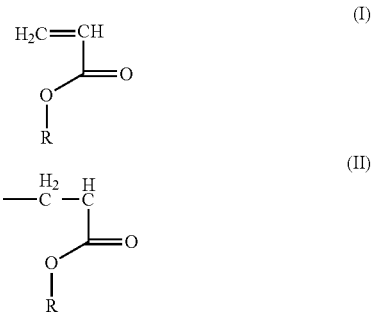

The term aryl refers to an aromatic moiety with one attachment point (e.g. phenyl, anthracyl, naphthyl, and the like). Apart from the attachment point, aryl group may be substituted with alkyl groups, alkyloxy, trialkylsilyl, trialkylsilyloxy, aryl, aryloxy groups or halides (e.g. F, Cl, I, Br).

The term alkyl refers to a linear, branched or cyclic alkane moiety with one attachment point (e.g. methyl, ethyl, propyl, n-butyl, tert-butyl, cyclohexyl and the like). Apart from the attachment point, alkyl groups may be substituted with alkyl groups, aryl groups or halides (e.g. F, Cl, I, Br). The number of carbons for specific alkyl moieties are as follows: C1 to C10 linear alkyl, a C3 to C10 branched alkyl, a C3 to C10 cyclic alkyl, a C4 to C10 alicyclic alkyl.

The term alkylene refers to a linear, branched or cyclic alkane moiety with two attachment point (e.g. methylene, ethylene, propylene and the like). Apart from the attachment points, alkylene groups may be substituted with alkyl groups, aryl groups, or halides (e.g. F, Cl, I, Br). The number of carbons for specific alkyl moieties is as follows: C1 to C10 linear alkylene, a C3 to C10 branched alkylene, a C3 to C10 cyclic alkylene, a C4 to C10 alicyclic alkylene.

The term alkyloxy, synonymous with the term "alkoxy," refers to a linear, branched or cyclic alkane moiety with one attachment through oxygen (e.g. methoxy, ethoxy, propoxy, n-butoxy, tert-butoxy, cyclohexyloxy and the like). Apart from the attachment point, alkyl groups may be substituted with alkyl groups, aryl groups or halides (e.g. F, Cl, I, Br). The number of carbons for specific alkyl moieties are as follows: C1 to C10 linear alkyloxy, a C3 to C10 branched alkyloxy, a C3 to C10 cyclic alkyloxy, a C4 to C10 alicyclic alkyloxy.

The term aryloxy refers to an aryl moiety as defined as above with on attachment point through an oxygen (e.g. phenyloxy, anthracyloxy and the like)

The term "substituted" refers to monovalent substituents such as alkyl, akyloxy, halide (e.g. F, Cl, and Br), aryl, aryloxy, and combination thereof unless otherwise indicated.

As used herein the term "thick film" refer to films which are from 5-100 microns thick and the term "ultra-thick film" refers to films which have a thickness from 100 and 400 microns.

Herein, when describing resist image profiles, the term "straight," and "Slight reentrant profile," designate profiles which are acceptable for further processing and indicate that the invention is working within acceptable parameters.

Herein, when describing the polymer component, a) of the novel composition described herein, it is understood that when describing individual mole % ranges for the repeat units of structure (1), (2), (3), and (4), that when adding these up the summation of these must add up to 100 mole % of repeat units.

Herein, when describing polymer component a) the summation of the mole % for each repeat unit, v, x, y, and z, respectively, must add up to 100%.

Herein, when describing individual wt. % ranges for these individual components a), b), c), d), e), f), and g) in the novel compositions described herein, it is understood that when summing up these components they must add up to 100 wt. %, if no other supplementary component or impurity is present. Because component e) and f) are optional component it is further understood that when these components are not present the summation of the other remaining essential components must also add up to 100 wt. %, if no other supplementary component or impurity is present. In either case, if an impurity or a supplementary component is present then the summation of all components including this impurity or other supplementary component must add up to 100 wt. %.

Herein are disclosed a Negative working, aqueous base developable, photosensitive photoresist novel composition comprising the following components:

a) A polymer containing the four repeat units of structures (1), (2), (3), and (4), but no other types of repeat units wherein v, x, y and z, respectively, represent the mole % of each repeat units of structures (1), (2), (3) and (4) in the polymer, and further wherein v ranges from about 20 to about 40 mole %, x ranges from about 20 to about 60 mole %, y ranges from about 5 to about 20 mole %, z ranges from about 3 to about 20 mole % and, further wherein $R_1$, $R_2$, $R_3$, and $R_4$, are independently selected from the group consisting of H and $CH_3$, and $R_5$ is a $C_1$ to $C_4$ alkyl moiety, and further still, wherein the summation of the mole % v, x, y and z, must add up to 100 mole %;

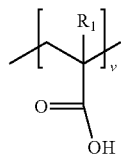

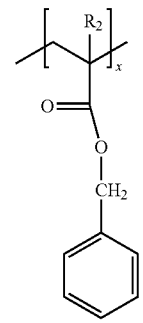

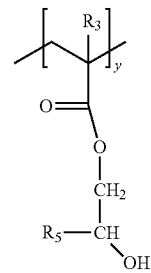

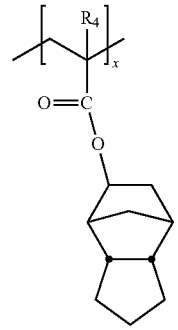

b) a radical photo-initiator component, which is comprised of at least one radical photo initiator which is activated by a broad absorption of radiation from about 360 nm to about 440 nm, and further wherein the wt. ratio of total wt. of said crosslinker component c) over total wt. of said radical photo-initiator which is activated by a broad absorption of radiation from about 360 nm to about 440 nm in radical photo-initiator component b) is from about 9 to about 40;

c) A crosslinker component consisting either of a mixture of crosslinkers of structure (5), (6) and (7) or a single crosslinker of structure (8) wherein $R_6$, $R_7$, $R_8$, and $R_{10}$ are independently selected from H or Methyl, and $R_9$ is selected from Methyl or Ethyl, and further wherein the wt. ratio of total wt. of said crosslinker component c) to said polymer a), ranges from about 0.71 up to about 1.2;

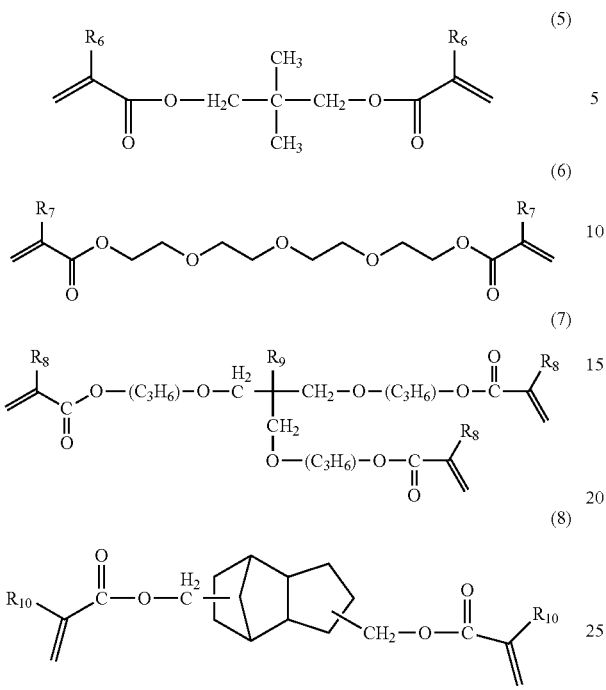

d) a radical inhibitor component containing at least one radical inhibitor;
e) an optional surfactant component containing at least one surfactant material;
f) an optional dissolution promoter component;
g) a solvent; and further wherein, said novel compositions it is free of colorants, pigments, lake pigments, organic particles, inorganic particles, metal oxide particles, metal particles, composite oxide particles, metal sulfide particles, metal nitride particles, metal acid nitride particles, inorganic salt particles, organic salt particles, colloidal particles, fibers, oxiranes, oxiranes based crosslinkers, polysiloxane polymers.

In another aspect the negative working, aqueous base developable, photosensitive photoresist novel composition is one consisting essentially of or consisting of the following components:
a) A polymer containing the four repeat units of structures (1), (2), (3), and (4), but no other types of repeat units wherein v, x, y and z, respectively, represent the mole % of each repeat units of structures (1), (2), (3) and (4) in the polymer, and further wherein v ranges from about 20 to about 40 mole %, x ranges from about 20 to about 60 mole %, y ranges from about 5 to about 20 mole %, z ranges from about 3 to about 20 mole % and, further wherein $R_1$, $R_2$, $R_3$, and $R_4$, are independently selected from the group consisting of H and $CH_3$, and $R_5$ is a $C_1$ to $C_4$ alkyl moiety, and further still, wherein the summation of the mole % v, x, y and z, must add up to 100 mole %;

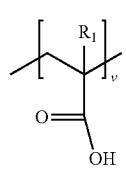

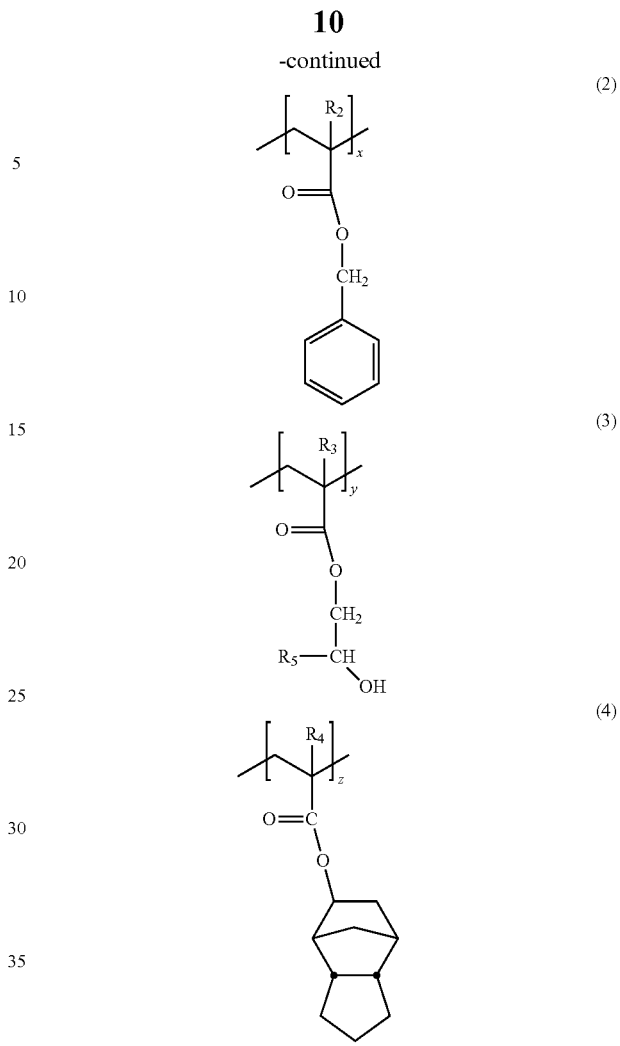

b) a radical photo-initiator component, which is comprised of at least one radical photo initiator which is activated by a broad absorption of radiation from about 360 nm to about 440 nm, and further wherein the wt. ratio of total wt. of said crosslinker component c) over total wt. of said radical photo-initiator component b);
c) a crosslinker component consisting either of mixture of crosslinkers of structure (5), (6) and (7), or a single crosslinker of structure (8) wherein $R_6$, $R_7$, $R_8$ and $R_{10}$ are independently selected from H or Methyl, and $R_9$ is selected from Methyl or Ethyl, and further wherein the wt. ratio of total wt. of said crosslinker c) mixture to said polymer a), ranges from about 0.71 up to about 1.2.

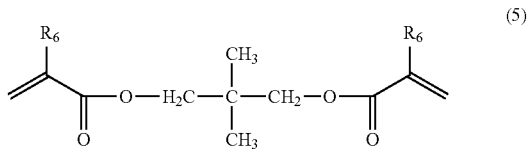

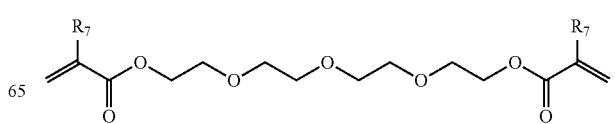

-continued

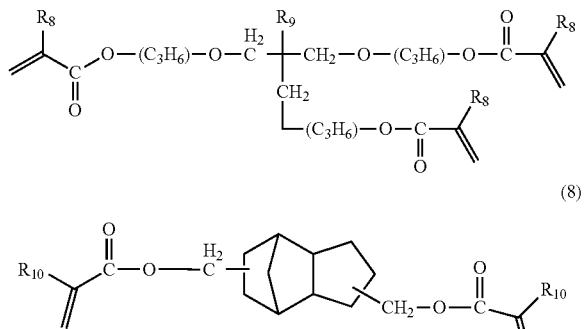

(7)

(8)

d) a radical inhibitor component containing at least one radical inhibitor;
e) an optional surfactant component containing at least one surfactant material;
f) an optional dissolution promoter component; and
g) a solvent.

For component a) the polymer containing the four repeat units of structure (1), (2), (3), and (4), in one aspect of any of the above described novel compositions is one in which said repeat unit of structure (1) $R_1$ is methyl. In another aspect of this embodiment $R_1$ is H.

In another embodiment of component, a), in the repeat unit of structure (2), $R_2$ is methyl; in another aspect of this embodiment $R_2$ is H.

In another embodiment of component, a), in the repeat unit of structure (3), $R_5$ is ethyl or methyl. In still another embodiment of this aspect of the novel composition in said structure (3) $R_5$ is methyl. In another aspect of this embodiment the repeat unit of structure (4), $R_3$ is hydrogen; in another $R_3$ is methyl.

In another embodiment of component, a), in the repeat unit of structure (4), $R_4$ is methyl; in another aspect of this embodiment $R_4$ is H.

In one aspect of any of the above described novel compositions, the polymer containing the four repeat units is one wherein for repeat unit (1), v ranges from about 25 to about 35 mole %; in another v ranges from about 27 to about 32 mole %; in yet another v ranges from about 28 to about 31 mole %; in still another, v is about 30 mole %.

In one aspect of any of the above described novel compositions the polymer containing the four repeat units is one wherein for repeat unit (2), x ranges from about 25 to about 55 mole; in another, x ranges from about 30 to about 50 mole %; in still another, x ranges from about 35 to about 48 mole %; in yet another, x is about 45 mole %.

In one aspect of any of the above described novel compositions the polymer containing the four repeat units is one wherein for repeat unit (3), y ranges from about 10 to about 20 mole %; in another, y ranges from about 12 to about 18 mole %; in yet another, y ranges from about 13 to about 16 mole %; in still another, y is about 15 mole %.

In one aspect of any of the above described novel compositions the polymer containing the four repeat units is one wherein for repeat unit (4), z ranges from about 5 to about 15 mole %; in another, z ranges from about 7 to about 13 mole %; in still another, z ranges from about 8 to about 12 mole %; in yet another, z ranges is about 10 mole %.

In one aspect of any of the above described novel compositions the polymer component b) containing the four repeat units is one wherein respectively the repeat units having structure (1), (2), (3) and (4), v s about 30 mole %, x is about 45 mole %, y is about 15 mole % and z is about 10 mole %.

Herein, when describing embodiments with different wt. % ranges for polymer component a), photoiniator component b) and crosslinker component c) it is understood that, in all cases, these different embodiments will maintain at least one of the ranges for the ratios described herein for the ratio [c)/a)] and the ratio [c)/b)].

In one aspect of any of the above described novel compositions, said crosslinker component c) is present from about 26 wt. % to about 56 wt. %, the total wt. of the composition. said crosslinker component c), is present from about 26 wt. % to about 50 wt. %, the total wt. of the composition.

In one aspect of any of the above described novel compositions, said crosslinker component c), is said mixture of crosslinkers (5), (6) and (7), and this mixture is one wherein (5) ranges from about 5 wt. % to about 20%; (6) ranges from about 1 to about 10 wt. % and (7) ranges from about 5 wt. % to about 20 wt. %, of the total wt. of the composition.

In one aspect of any of the above described novel compositions, said crosslinker component c), is said mixture of crosslinker (5), (6) and (7) and is present from about 26 wt. % to about 56 wt. %, the total wt. of the composition. In another aspect of this embodiment novel compositions, said crosslinker mixture, is present from about-26 wt. % to about 50 wt. %, the total wt. of the composition.

In one aspect of any of the above described novel compositions, said crosslinker component c), is the single crosslinker (8) and is present from about 26 wt. % to about 56 wt. %, the total wt. of the composition.

In one aspect of any of the above described novel compositions, said crosslinker component c), is the single crosslinker (8) and is present from about 26 wt. % to about 50 wt. %, the total wt. of the composition.

In one particular aspect of the above described novel compositions, said crosslinker component c) is the single crosslinker (8), whose content ranges from about 26 wt. % to about 56 wt. % of the composition. In another embodiment of this aspect of the invention, the single crosslinker (8), content, ranges from about 26 wt. % to about 33 wt. % of the composition.

In any of the above described novel compositions said radical photo-initiator component b) is comprised of at least one radical photo initiator which is activated by a broad absorption of radiation from about 360 nm to about 440 nm. In one aspect of this embodiment, at least one of the radical photo-initiator(s) in this component b) has a molar absorbance of at least of at least 200 AU*L*mole$^{-1}$*cm$^{-1}$ at i-line (364.4 nm); at least 100 AU*L*mole$^{-1}$*cm$^{-1}$ at h-line (404.7) and at least 20 AU*L*mole$^{-1}$*cm$^{-1}$ at g-line (435.8 nm), as measured in acetonitrile solution, capable of generating a photo-radical; in another aspect of this embodiment at least one has a molar absorbance of at least 100 AU*L*mole$^{-1}$*cm$^{-1}$ at h-line (404.7) and at least 20 AU*L*mole$^{-1}$*cm$^{-1}$ at g-line (435.8 nm). In another aspect of this embodiment, at least one radical photo-initiator in this component b) has a molar absorbance of at least 1000 AU*L*mole$^{-1}$*cm$^{-1}$ at i-line (364.4 nm), at least 790 AU*L*mole$^{-1}$*cm$^{-1}$ at h-line (404.7) and at least 130 AU*L*mole$^{-1}$*cm$^{-1}$ at g-line (435.8 nm) capable of generating a photo-radical as measured in an acetonitrile solution; in another aspect of this embodiment it has at least a molar absorbance of 790 AU*L*mole$^{-1}$*cm$^{-1}$ at h-line (404.7) and at least 130 AU*L*mole$^{-1}$*cm$^{-1}$ at g-line (435.8 nm). In another aspect of these embodiment this radical photoinitiator having a broad absorption from about 360 nm to about 440 nm is also one which is capable of breaching at these wavelength upon photodecomposition to generate radical, allowing greater depth of penetration into the novel composition when it is coated as a thick resist film and irradiated during patterning. In another aspect of this embodiment this radical photo-initiator having a broad absorption from about 400 nm to about 440 nm is one which is capable of breaching at these wavelength upon photodecomposition to generate radical, allowing greater depth of penetration into the novel composition when it is coated as a thick resist film and irradiated during patterning.

In one aspect of any of the above described novel compositions, said photoinitiator component b) may be present from about 0.25 wt. % to about 3.5 wt. %, the total wt. of the composition. In another aspect of this embodiment, said photoinitiator, component b), may be present from about 0.5 wt. % to about 2.0 wt. %, the total wt. of the composition.

In one more specific embodiment of said components b) and c), said ratio of total said crosslinker component c) over total wt. of said radical photo-initiator component b) (which is activated by a broad absorption of radiation from about 360 nm to about 440 nm), originally specified from about 9 to about 40, may in other embodiments be specified in a narrower range as follows: In one embodiment it may range from about 9 to about 30. In another aspect of this embodiment the ratio may range from about 9.5 to about 30. In another aspect of this embodiment the ratio may range from about 9.5 to about 28. In yet another aspect of this embodiment it may range from about 9.7 to about 26.

In another more specific embodiment, of said ratio of total said crosslinker component c) over total wt. of said radical photo-initiator b); this ratio may range from about 15 to about 30. In yet another aspect of this embodiment the ratio may range from about 18 to about 28. In still another aspect of this embodiment the ratio may range from about 18 to about 25. In a still more specific embodiment it may range from about 19 to about 22.

In one specific embodiment of said radical photo-initiator component b), comprises a radical photo-initiator which is activated by a broad absorption of radiation which is an arylacyl-phosphine oxide photoinitiator component. This arylacyl-phosphine oxide photoinitiator component may be selected from mono(arylacyl)-phosphine oxides, di(arylacyl)-phosphine oxides, tri(arylacyl)-phosphine oxides or a mixture of different acylphosphine oxide photoinitiators.

Optionally, in this embodiment, additional other types of secondary additives may be present in component c) such as photoinitiators and sensitizers in addition to the arylacyl-phosphine oxide photoinitator(s) component, described above. Non-limiting examples are such as oxime ester, benzophenone derivatives, dieneones, xanthones, thioxanthones, alkylaryl ketones, and the like. More specific non-limiting examples of such secondary additives are 1,2-Octanedione, 1-[4-(phenylthio)phenyl]-, 2-(O-benzoyloxime)-(OXE01), Ethanone, 1-[9-ethyl-6-(2-methylbenzoyl)-9H-carbazol-3-yl]-, 1-(O-acetyloxime)-(OXE-02), Oxime ester-Photo acid generator, fluorinated-(OXE-03), 2-Methyl-1[4-(methylthio)phenyl]-2-morpholinopropan-1-one) (Irgacure® 907), halogenated-2,5cyclohexadienone, benzophenone, alkylaryl ketone or diketone type, or mixtures thereof Any of a variety of free radical generating photoinitiators can be used as a secondary component in component b) in the current invention. Benzophenone derivatives such as benzophenone, bis-4,4'-dimethylaminobenzophenone (Michler's ketone), bis-4,4'-diethylaminobenzophenone (ethyl Michler's ketone), benzophenones singly or multiply substituted with other alkylamino groups, chloro, methoxy, substituted xanthones, thioxanthones, anthrones, and fluorenones are useful radical initiators, as well as alkyl, chloro, and alkyloxy substituted thioxanthones. Substituted cyclohexadienones can be also be used, such as with both an alkyl and a trichloromethyl substituent in the 4 position. Alkylarylketone derivatives include ketaldonyl alcohols such as benzoin, pivaloin, and acyloin ethers such as benzoin alkyl ethers, benzoin aryl ethers, alphahydrocarbon substituted aromatic acyloins, benzoin dialkyl ketals, benzil, benzoin esters, O-acylated oximinoketones, and alpha-amino ketones such as alpha-aminoactophenone derivatives. Substituted or unsubstituted polynuclear quinones such as 9,10-anthroquinones, 1,4-naphthquinones, and phenanthrene quinones are also possible initiators. Tertiary amines suitable as electron and or hydrogen donors can also be used as part of the initiating component such as substituted N,N-dialkylaminobenzene derivatives and ethyl-4-(dimethylamino)benzoate. Useful diketones include biacetyl, 2,3-dibenzoyl-2-norbornene, benzoylbenzal chloride, 2,2-dibromo-2(phenylsulfonyl)propanedione, alpha-naphthyl, 2,3-bornanedione, phenylpuruvic acid and 2,4-pentanedione. Representative quinones that can be used include 4-benzoquinone, 2-benzo-quinonediazide, anthraquinone, 2-methylanthraquinone, 2,6-dimethoxyanthra-quinone, 2,4,8-trichloroanthraquinone, amino anthraquinone, 1,4-napthoquinone derivatives and phenanthrenequinones and the like.

In one aspect of the embodiment described above in which the main radical photoinitator component is an arylacylphosphine oxide photoinitiator or mixtures of these, it may selected from one having structure (9); wherein Ria, Rib, Ric, Rid, and Rie, are independently selected from H, Cl, or a C-1 to C-8 alkyl and Rif are independently selected from a C-1 to C-8 alkyloxy moiety, a phenylacyl moiety, a having structure (9a), and an aryl having structures (9b), and Rig is a phenylacyl moiety, a having structure (9a), or an aryl having structures (9b); wherein Riaa, Riba, Rica, Rida, Riea, Riab, Ribb, Ricb, Ridb, and Rieb are independently selected from H, Cl and a C-1 to C-8 alkyl, and $\sim\!\!\sim\!\!\sim$ represent the attachment point of said phenylacyl of structure (9a), or said phenyl moiety of structure (9b) to the phosphorous in structure (9). In this embodiment said radical photo-initiator component b) may be comprised of one of these types of acylphosphine initiators or a mixture of these. In this embodiment, optionally, phenyl acyl containing ketaldonyl alcohol or ketaldonyl amino photoinitiators having structure (9c) or (9ca) may also be present as secondary photoinitiator components, wherein in (9c) Riac, Ribc, Ricc, Ridc, Riec, are independently selected from a C-1 to C-8 alkyl, a hydrogen, or a C-1 to C-8 thioalkyl and Rifc and Rigc are independently selected from a C-1 to C-8 alkyl, and further, wherein in (9ca) Riad, Ribd, Ricd, Ridd, Ried, are independently selected from a C-1 to C-8 alkyl, a hydrogen, or a C-1 to C-8 thioalkyl, and Rifd and Rigd are independently selected from a C-1 to C-8 alkyl, and Rhd and Rid are independently selected from a C-1 to C-8 alkyl or are two alkyl group joined together to form a five or six membered ring containing the amino moiety, which may optionally, also containing an oxygen not adjacent to the nitrogen.

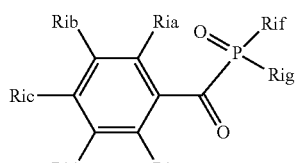

(9)

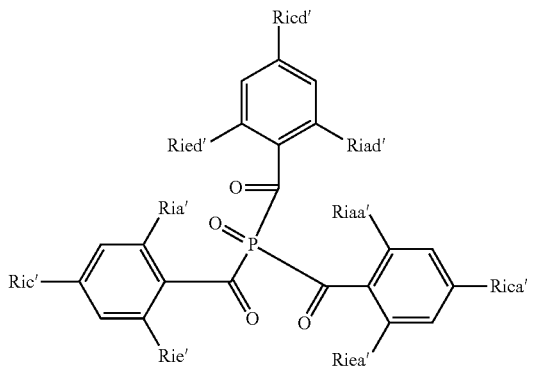

(9a)

(9b)

(9c)

(9ca)

In one specific embodiment of said photo-initiator of radical component b), this component is a acylphosphine photoinitiator having structures (9d), (9e), (9f), (9g) or a mixture of these, wherein, independently, Ria', Riaa', Riad', Ric', Rica', Ricd', Rie', Riea', and Ried', are independently selected from H or a C-1 to C-8 alkyl, and Rif is a C1-C8 alkyl. In another aspect of this embodiment, said acylphosphine photoinitiator is selected from ones having structures (9e), (9f), (9g) or a mixture of these. In yet another embodiment said photo-initiator is selected from ones having structures (9e), (9f) or a mixture of these. In yet another embodiment said photoinitiator is selected from one having structure (9e), (9g) or a mixture of these. In still another embodiment said photoinitiator is one having structures (9e). Optionally, in these embodiments, a secondary radical initiator phenyl acyl containing ketaldonyl alcohol photoinitiators having structure (9h) or a ketaldonyl amino (9ha) may also be part of the said photo-initiator of radical component b), wherein in (9h) Riac', Ribc', Ricd', are independently a C-1 to C-4 alkyl, and further wherein, Ridc' and Riec' are independently a C-1 to C-8 alkyl, and in (9ha) Riad', Ricd', are hydrogen or a C-1 to C-4 alkyl, Ribd' is a C-1 to C-4 alkyl or a C-1 to C-4 thioalkyl moiety, Ridd' and Ried' are independently selected from a C-1 to C-4 alkyl and X is O, S or CH$_2$.

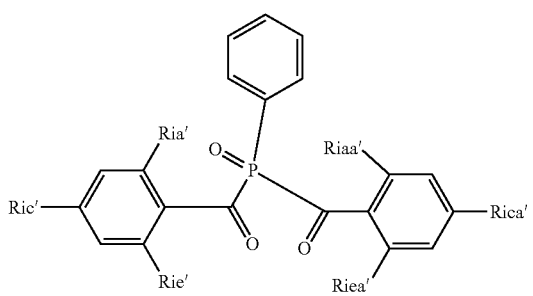

(9d)

(9e)

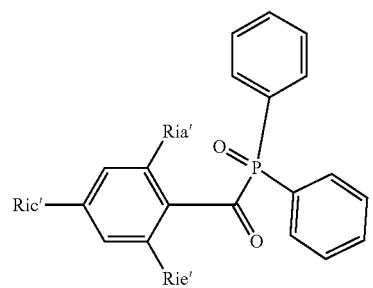

(9f)

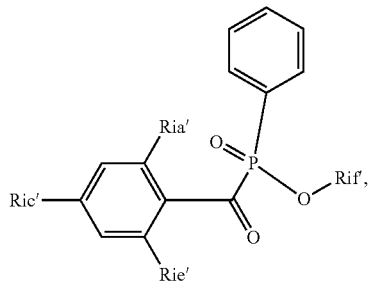

(9g)

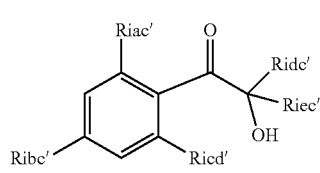

(9h)

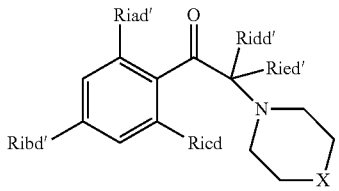
(9ha)

In one specific embodiment of said photo-initiator of radical component b), this component is a acylphosphine photoinitiator having structures (9i), (9j), (9k), or a mixture of these. In another aspect of this embodiment, said acylphosphine photoinitiator is selected from ones having structures (9i), (9j) or a mixture of these. In yet another embodiment said photo-initiator is selected from ones having structures (9i), (9k) or a mixture of these. In yet another embodiment said photoinitiator is selected from one having structure (9j), (9k) or a mixture of these. In yet another embodiment said photoinitiator is selected from one having structure (9i), Optionally, in these embodiments, either a secondary radical initiator a phenyl acyl containing ketaldonyl alcohol having structure (9l) or a phenyl acyl containing ketaldonyl amino photoinitiators having structure (9la) may also be part of the said photo-initiator of radical component b).

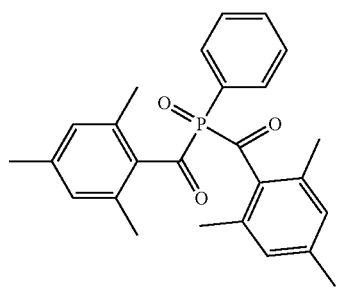
(9i)

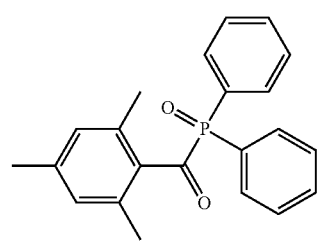
(9j)

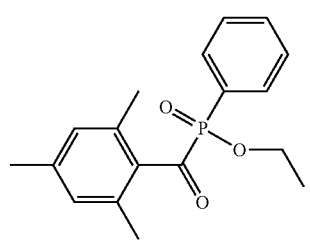
(9k)

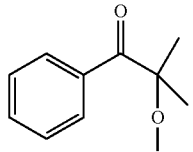
(9l)

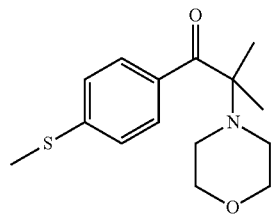
(9la)

In one particular embodiment of said photo-initiator of radical component b) it is the compound of structure (9i).

In one embodiment of any of the above novel compositions, the loading of said radical photo-initiator component b) ranges from about 1 to 4 wt. % of the solution. In one aspect of this embodiment these photo-initiators are present from about 1.2 to about 3.5 wt. % of the total solution. In another aspect of this embodiment the radical initiator is present from about 1.3 to about 3.4 wt. %. In still another it is present from about 1.35 to about 3.35 wt. %.

In one aspect of any of the above described novel compositions, for crosslinker component c), it is a mixture of crosslinkers (5), (6) and (7).

In one aspect of the inventive composition when component c) is the mixture of crosslinkers (5), (6) and (7), it is one, in which, for component (5), $R_6$ is methyl; in another $R_6$ is H.

In one aspect of the inventive composition when crosslinker component c) is the mixture of crosslinkers (5), (6) and (7), it is one in which, (5), $R_6$ is methyl; in another $R_6$ is H.

In one aspect of the inventive composition when crosslinker component c) is the mixture of crosslinkers (5), (6) and (7), it is one in which, (6), $R_7$ is methyl; in another $R_7$ is H.

In one aspect of the inventive composition when crosslinker component c) is the mixture of crosslinkers (5), (6) and (7), it is one, in which, (7), $R_8$ is methyl; in another, $R_8$ is H.

In one aspect of the inventive composition when crosslinker component c) is the mixture of crosslinkers (5), (6) and (7), it is one, in which, (7), $R_9$ is Methyl; in another, $R_9$ is Ethyl.

In one aspect of the inventive composition when crosslinker component c) is the mixture of crosslinkers (5), (6) and (7), it is one, in which, $R_6$ is Methyl, $R_7$ is H, $R_8$ is H and $R_9$ is Ethyl.

In one aspect of the inventive composition crosslinker component c) is said single crosslinker (8). In another aspect of this embodiment $R_{10}$ is $CH_3$. In another aspect of this embodiment R10 is H.

As described above, the weight ratio of said cross-linker component c) to said polymer a) is from about 0.71 up to about 1.2; however, in another aspect this ratio may range from about 0.75 to about 1.1. In another aspect of this embodiment the weight ratio of said cross-linker component c) to said polymer component a) is about 0.80 to about 1.0.

Given the above described limitation on ratio, in one aspect of any of the above described novel compositions, said polymer, has as a weight % of the novel composition from about 20 to about 50 wt. %.

In another aspect of any of the above described novel compositions, said crosslinker mixture, is one, in which, (5) ranges from about 5 wt. % to about 20%; (6) ranges from about 1 to about 10 wt. % and (7) ranges from about 5 wt. % to about 20 wt. % of the total wt. of said novel composition.

In another aspect of any of the above described novel compositions, when said crosslinker component c) is said mixture of crosslinkers, it is a mixture, in which, (5) ranges from about 6 wt. % to about 18 wt. %, (6) ranges from about 1 wt. % to about 8 wt. % and (7) ranges from about 7 wt. % to about 18 wt. % of the total wt. of the novel composition.

In another aspect of any of the above described novel compositions, said crosslinker mixture, is one, in which, (5) ranges from about 8 wt. % to about 16 wt. %, (6) ranges from about 1.5 wt. % to about 6 wt. % and (7) ranges from about 9.5 wt. % to about 18 wt. % of the total wt. of the said novel composition.

In another aspect of any of the above described novel compositions, wherein the crosslinker component c) is said crosslinker mixture of crosslinker (5), (6) and (7), it is one, in which, (5) ranges from about 9 wt. % to about 15 wt. %, (6) ranges from about 2.5 wt. % to about 5 wt. % and (7) ranges from about 10 wt. % to about 20 wt. % of the total wt. of the said novel composition.

In another aspect of any of the above described novel compositions, wherein the crosslinker component c) is said crosslinker mixture of crosslinker (5), (6) and (7), it is one, in which, (5) ranges from about 10 wt. % to about 15 wt. %, (6) ranges from about 2.5 wt. % to about 4.5 wt. % and (7) ranges from about 12 wt. % to about 18 wt. % of the total wt. of the said novel composition.

It has been found that small molecule radical inhibitor components, added as a minor component in the novel composition, have beneficial effects, particularly in preventing scumming of features at the resist substrate interface. This, contrasts with the situation when the radical inhibitor component is present as a major component such as in PSA based resist systems, where the resist polymer is a radical inhibitor, can lead to deleterious imaging of negative resists, as previously discussed.

In one aspect of any of the above described novel compositions, said radical inhibitor component d) may be present from about 0.01 wt. % to about 0.7 wt. %, the total wt. of the composition. In another aspect of this embodiment, said radical inhibitor component d), may present from about 0.05 wt. % to about 0.5 wt. %, the total wt. of the composition. In yet another aspect of this embodiment, the loading of radical inhibitor component may range from about 0.07 to about 0.4 wt. % of the total weight of the novel composition.

Component d), the radical inhibitor component of the present invention, include inhibitors which are stable analogs of 5-member or 6-membered heterocyclic structures that contain a stable nitroxide radical and stable analogs of alkyl chains that contain a stable nitroxide radical. Examples of suitable structures include the following:

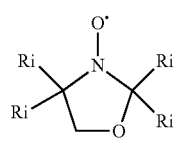

(10)

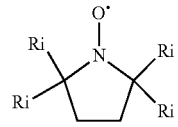

(11)

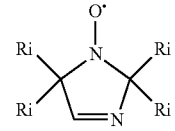

(12)

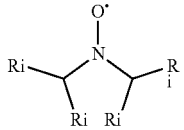

(13)

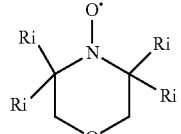

(14)

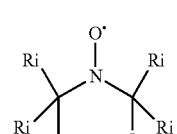

(15)

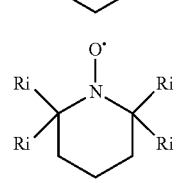

(16)

As illustrated by the above structures (10) to (16), full substitution of the carbon atoms adjacent to the nitroxide radical is required. Such substitution is required for the inhibitor to be thermally stable and sufficiently non-volatile. Substitution at other positions in the ring or chain structures is contemplated to further reduce the volatility of the scavenger.

Suitable Ri substituents, in structures (10) to (16), are alkyl groups which include methyl groups ($CH_3$), linear alkyl group having 2 to 18 carbon atoms, and branched chain alkyl groups having 3 to 18 carbon atoms. Ri can be either the same or different. These linear and branched chain alkyl groups can be further substituted. Examples of such substituents carboxyl ($CO_2H$), alkylcarboxyl ($CO_2R$), hydroxyl (OH), alkyloxy (OR), cyano (CN), aminocarbonylalkyl (NHCOR), succimido ($C_4H_4NO_2$), sulfonic ($SO_3H$), alkyl sulfonate (O—$SO_2$—R) and alkyl sulfone ($SO_2R$), wherein R is a linear or branched alkyl substituent with 1 to 18 carbon atoms. Other examples of suitable substituents include cycloalkyl or polycycloalkyl substituents having 5 to 18 carbon atoms. These cyclic substituents can be bound to the 1 position (i.e. the carbon atom adjacent to the nitroxide radical in the scavenger) via one bond or two.

As previously noted, the inhibitor can be further substituted in order to further reduce its volatility. Examples of these substituents include the substituted alkyls and cycloalkyls described above. Other substituents include alkylcarbonyl (RC=O), carboxyl ($CO_2H$), alkyl carboxylate ($CO_2R$), alkyl sulfonate ($O-SO_2R$), alkyl sulfinate (O—SO—R), alkyl sulfone (SO—R) and alkyl ether (O—R) wherein alkyl is as defined above. It is advantageous if these substituents are not highly absorbent of the exposing radiation. However, the use of more UV-absorbent aryl ballast groups such as benzene and naphthalene is contemplated provided that the quantity of these substituents does not adversely affect lithographic performance.

Other examples of suitable inhibitor include stable radicals that are useful inhibitors in radical polymerization. Such radicals are known to one skilled in the art. Examples of such radicals include diphenylpicrylhydrazyl, triphenyl methyl, triphenyl verdazyl and galvinoxyl. Further examples of scavengers include quinones such as chloranil, benzoquinone and alkyl substituted benzoquinone.

The loading of radical inhibitor component ranges from about 0.01 to about 0.1 wt. % of the total weight of the novel composition.

In one embodiment of the present invention the radical inhibitor is 4-hydroxy-2,2,6,6-tetramethyl-1-Piperidinyloxy (Lignostab 1198) (17). In one embodiment of this aspect of the invention the loading of (17) is from about 0.01 to about 0.1 wt. % of the novel composition. In another aspect of this embodiment the loading of (16) is 0.069 wt. %.

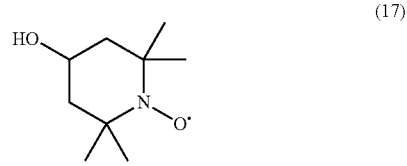

(17)

In one embodiment of any of the above novel compositions further comprises, component e), the surfactant component. In one aspect of this embodiment the surfactant is selected from the group consisting of non-ionic surfactants, anionic surfactants and amphoteric surfactants.

In one specific embodiment, where the novel composition contains a surfactant, this surfactant is a non-ionic for example a polyoxyethylene alkyl ethers such as polyoxyethylene lauryl ether, polyoxyethylene oleyl ether and polyoxyethylene cetyl ether; polyoxyethylene fatty acid diesters; polyoxy fatty acid monoesters; polyoxyethylene-polyoxypropylene block polymers; acetylene alcohols; acetylene glycols; polyethoxylates of acetylene alcohols; acetylene glycol derivatives such as polyethoxylates of acetylene glycols; fluorine-containing surfactants, such as Fluorad (trade name, manufactured by Sumitomo 3M Ltd.), MEGAFACE (trade name, manufactured by DIC Corporation) such as Megaface: R-2011 (fluorinated polymer), R-40: (Oligomer with fluoro, hydrophilic and lipophilic group, nonionic, liquid), R-41: (Oligomer with fluoro and lipophilic group, nonionic, liquid), R43: (Oligomer with fluoro and lipophilic group, nonionic, liquid,) MFS-344: (Oligomer with fluoro and lipophilic group, nonionic, liquid). Other non-ionic surfactants include Surufuron (trade name, manufactured by Asahi Glass Co., Ltd.); and organosiloxane surfactants such as KP341 (trade name, manufactured by Shin-Etsu Chemical Co., Ltd.). Examples of the above-described acetylene glycols include 3-methyl-1-butyne-3-ol, 3-methyl-1-pentyne-3-ol, 3,6-dimethyl-4-octyne-3,6-diol, 2,4,7,9-tetramethyl-5-decyne-4,7-diol, 3,5-dimethyl-1-hexyne-3-ol, 2,5-dimethyl-3-hexyne-2,5-diol and 2,5-dimethyl-2,5-hexanediol. In one specific embodiment, the surfactant is a Fluorosilicon modified nonionic surfactant In one specific embodiment where the novel composition contains a surfactant where this surfactant is an anionic surfactant, this anionic surfactant is selected from an anionic surfactants; which may be selected from ammonium salts and organic amine salts of alkyldiphenyl ether disulfonic acids; ammonium salts and organic amine salts of alkyldiphenyl ether sulfonic acids; ammonium salts and organic amine salts of alkylbenzenesulfonic acids; ammonium salts and organic amine salts of polyoxyethylene alkyl ether sulfuric acids; and ammonium salts and organic amine salts of alkyl sulfuric acids.

In one specific embodiment where the novel composition contains a surfactant where this surfactant is an amphoteric surfactant, examples of the amphoteric surfactants include 2-alkyl-N-carboxymethyl-N-hydroxyethyl imidazolium betaine and lauric acid amide propylhydroxysulfone betaine.

In the above embodiments where the novel composition comprises a surfactant, these surfactants may be used individually, or two or more thereof may be used in combination, and the blending ratio thereof is usually 0.005 to 0.5 wt. %; preferably 0.01 to 0.4 wt. %, more preferably 0.1 to 0.4 wt. % with respect to the total wt. of the novel composition. In one aspect of this embodiment the surfactant is a tert-$Bu_2$-ethylhexaneperoxoate-initiated ester copolymer of 3,3,4,4,5,5,6,6,7,7,8,8,8-tridecafluorooctyl-1 2-Propenoic acid and α-(2-methyl-1-oxo-2-propen-1-yl)-co-hydroxypoly[oxy(methyl-1,2ethanediyl)], [cas #1108730-36-4] [Megaface R-2011]; in the embodiment the loading may range from about 0.1 to about 0.4 Wt. % of the total novel composition; in another from about 0.2 to about 0.3 wt. %; and in another about 0.24 wt. %.

In all the above embodiments, component g), the solvent, these may include, for example, a glycol ether derivative such as ethyl cellosolve, methyl cellosolve, propylene glycol monomethyl ether, diethylene glycol monomethyl ether, diethylene glycol monoethyl ether, dipropylene glycol dimethyl ether, propylene glycol n-propyl ether, or diethylene glycol dimethyl ether; a glycol ether ester derivative such as ethyl cellosolve acetate, methyl cellosolve acetate, or propylene glycol monomethyl ether acetate; carboxylates such as ethyl acetate, n-butyl acetate and amyl acetate; carboxylates of di-basic acids such as diethyloxylate and diethylmalonate; dicarboxylates of glycols such as ethylene glycol diacetate and propylene glycol diacetate; and hydroxy carboxylates such as methyl lactate, ethyl lactate, ethyl glycolate, and ethyl-3-hydroxy propionate; a ketone ester such as methylpyruvate or ethyl pyruvate; an alkyloxycarboxylic acid ester such as methyl 3-methoxypropionate, ethyl 3-ethoxypropionate, ethyl 2-hydroxy-2-methylpropionate, or methylethoxypropionate; a ketone derivative such as methyl ethyl ketone, acetyl acetone, cyclopentanone, cyclohexanone or 2-heptanone; a ketone ether derivative such as diacetone alcohol methyl ether; a ketone alcohol derivative such as acetol or diacetone alcohol; lactones such as butyrolactone; an amide derivative such as dimethylacetamide or dimethylformamide, anisole, and mixtures thereof.

In another aspect of this invention, the optional dissolution promoter component f), when present, is selected from compounds comprising a carboxylic acid group, or compounds comprising, multiple phenol groups.

When component f) is a compound comprising a carboxylic acid group, this compound must be nonvolatile carboxylic acid having a boiling point above 300° C. which also has a good solubility in an aqueous base such as 0.26 N tetramethylammonium hydroxide (TMAH). Non-limiting examples of such materials are cholic acid derivatives such as cholic acid, lithocholic acid, deoxycholic acid, and the like.

When component f) is a compound comprising a multiple phenol group, such compounds must also have a boiling point above 300° C., and have a good solubility in 0.26 N TMAH. These compounds comprising multiple phenol group may comprise two (dimer) or more such as trimer phenolic compound, tetramer phenol moieties, or higher (e.g. 10 phenolic moieties) wherein the phenolic moieties in these compounds are linked together through a linking group such as an alkylene moiety, an oxy moiety, a —SO$_2$— moiety and the like. Non-limiting examples of such compounds are shown in structures (18), (18a), (18b), (19), (19a), (19b), (20) to (30), wherein the linking groups Xp and Xpa are independently selected from a —O—, —CH$_2$—, —C(CH$_3$)$_2$—, —SO$_2$—; Rp1 is hydrogen or an alkyl moiety, Rp2, Rp3, Rp4, Rp5 are independently selected from hydrogen or an alkyl moiety.

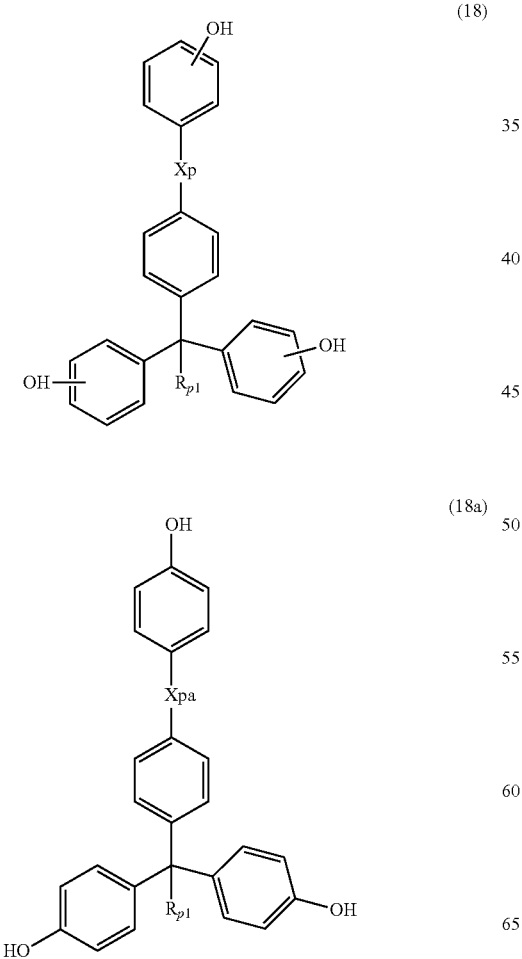

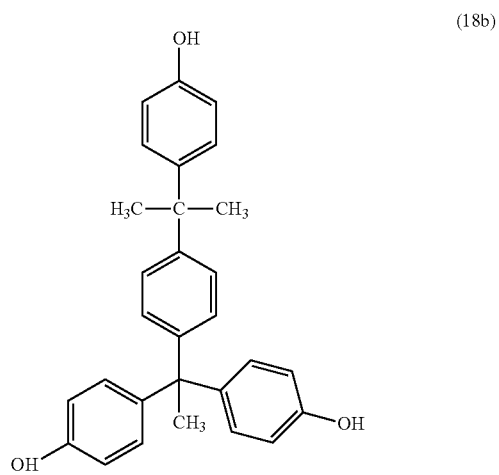

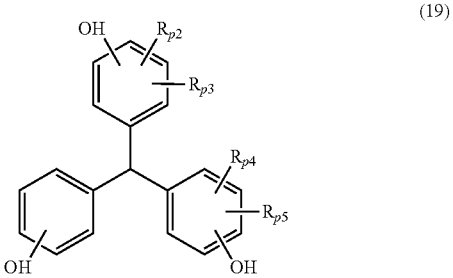

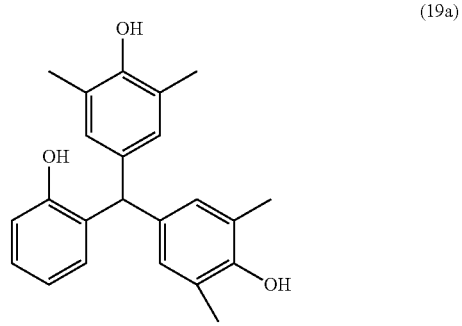

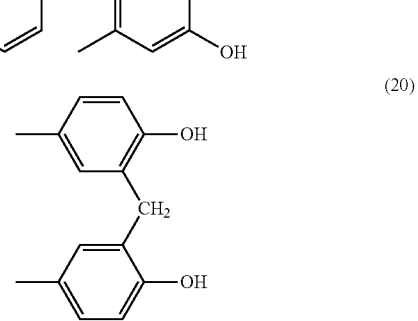

(21) 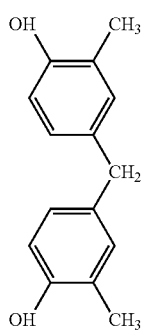
(22) 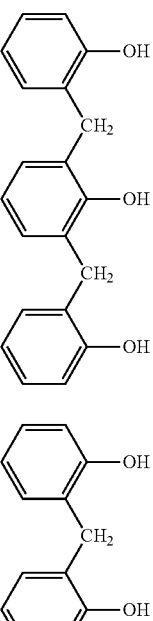
(23) 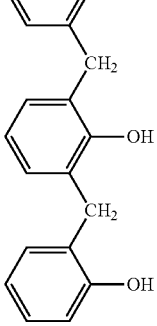
(24) 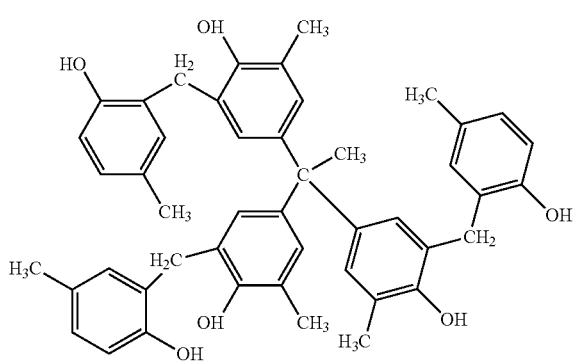
(25) 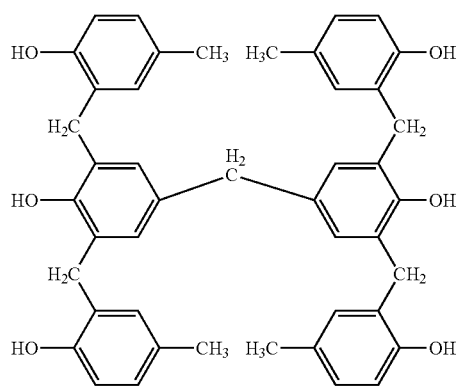
(26) 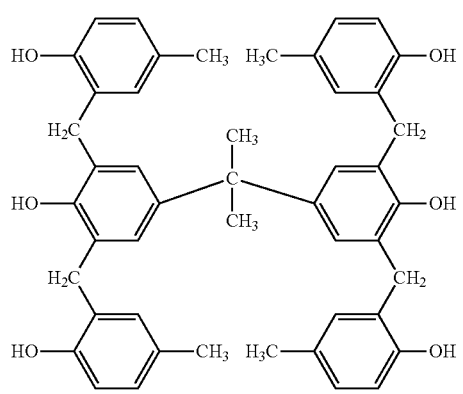
(27) 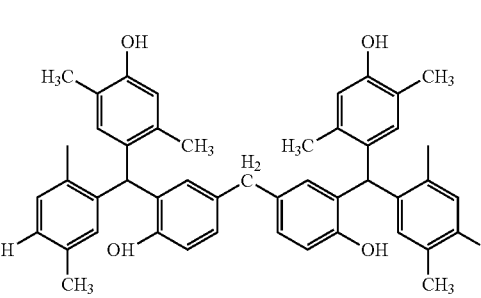
(28) 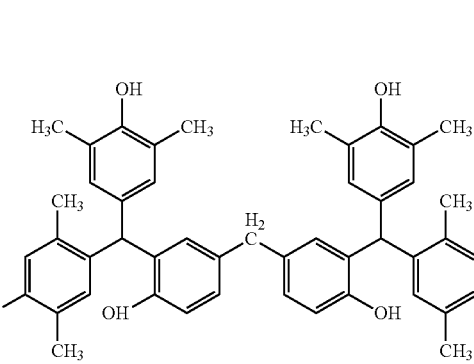

-continued (29)

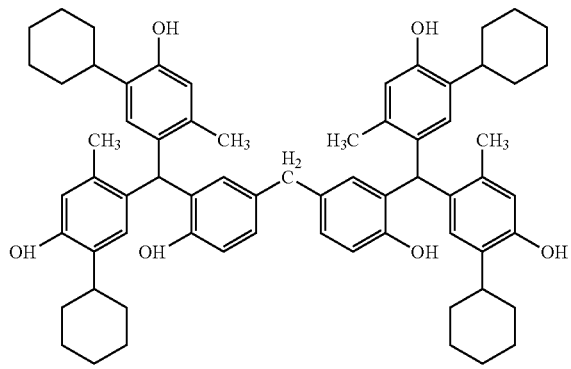

(30)

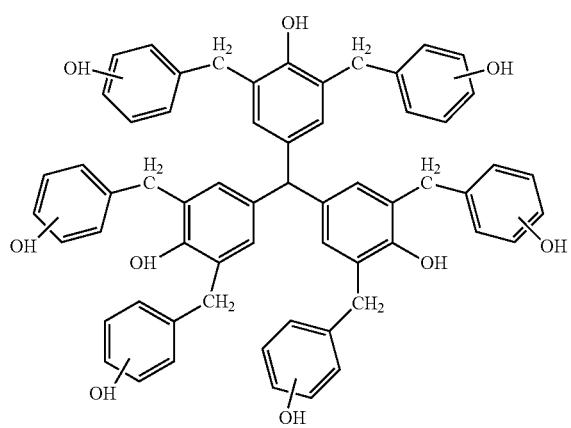

In one embodiment of the above inventive composition, wherein the optional dissolution promoter f) is present, this dissolution promoter has structure (18), as described above.

In another embodiment of the above inventive composition, wherein the optional dissolution promoter f) is present, this dissolution promoter has structure (18a) as described above.

In another embodiment of the above inventive composition, wherein the optional dissolution promoter f) is present, this dissolution promoter has structure (19); wherein Rp2, Rp3, Rp4, Rp5 are independently selected from hydrogen or an alkyl moiety, as described above.

In another aspect of the above embodiment in which the optional dissolution promoter component f) it is present from about 0.1 wt. % to about 5.0 wt. % of the total wt. of the composition. In another aspect of this embodiment it is present from about 0.5 wt. % to about 4 wt. %. In yet another aspect it is present from about 1 wt. % to about 3.6 wt. %.

In another aspect of this embodiment of this invention, component g), the solvent, is selected from the group consisting of a glycol ether derivative, a glycol ether ester derivative a carboxylate, a carboxylate of a di-basic acid, a dicarboxylate of a glycol, a hydroxy carboxylate, a ketone ester; an alkyloxycarboxylic acid ester a ketone derivative, a ketone ether derivative, a ketone alcohol derivative, an amide derivative, and mixtures thereof.

In a further embodiment of this invention, component g), the solvent, is selected from 2-Methoxy-1-methylethyl acetate (PGMEA).

The process of obtaining a negative resist image using a single coating step comprising the steps of;

a) applying any of the above described novel compositions on a semiconductor substrate to form a coating;
b) a baking step wherein in a first baking step said coating is baked at a first baking temperature ranging from about 100 to about 150° C. for about 5 to about 15 minutes; followed by a second baking at a second baking temperature ranging from about 100 to about 150° C. for a second baking time of 5 to 15 minutes;
c) exposing through a mask said coating baked in step b) to radiation whose wavelength ranges from about 350 to about 450 nm forming an exposed part of coating which is insoluble in aqueous base developer and an unexposed part of the coating which is soluble in aqueous base developer;
d) developing said coating obtained in step c) or d) with an aqueous base developer.

In another embodiment of process of obtaining a negative resist image using a single coating step is one wherein in baking step b) said first baking temperature and said second baking temperature may be from about 120° C. to about 150° C., and further wherein each for about 6 to about 10 minutes; in yet another embodiment of this step the first baking and the second baking may be about 130° C. for about 8 minutes.

In one embodiment of the above negative imaging, single coat process is one wherein in said first baking in step b) the baking temperature for the first step is about 130° C.

In one embodiment of the above negative imaging, single coat process in baking step b) said first baking temperature time is about 8 minutes.

In one embodiment of the above negative imaging, single coat process in baking step b) said first temperature is about 130° C. and the baking time is about 8 minutes.

In one embodiment of the above negative imaging, single coat process in baking step b) said second baking temperature is about 130° C.

In one embodiment of the above negative imaging, single coat process in baking step b) said second baking temperature time is about 8 minutes.

In one embodiment of the above negative imaging, single coat process, in baking step b) said second baking temperature is about 130° C. and said second baking time is about 8 minutes.

In on embodiment of the above negative imaging single coat process is one wherein the radiation employed in step c) ranges from about 360 nm to about 440 nm.

In on embodiment of the above negative imaging single coat process is one wherein the radiation employed in step c) ranges from about 400 nm to about 440 nm.

In on embodiment of the above negative imaging single coat process is one wherein the radiation employed in step d) ranges from about 360 nm to about 440 nm.

In on embodiment of the above negative imaging single coat process is one wherein the radiation employed in step d) ranges from about 400 nm to about 440 nm.

In one embodiment of the above negative imaging process instead of a single coat a double coat process is employed comprising the step of:

a') applying any of the above described novel compositions on a semiconductor substrate to form a first coating
b') a first baking step wherein said first coating is baked at a temperature ranging from about 100 to about 150° C. for about 5 to about 15 minutes
c') applying said novel composition used in step a) on top of said first coating to form a second coating d') a second baking wherein said first coating and said second coating at a temperature ranging from about 100 to about 150° C. for about 5 to about 15 minutes to form a combined coating.

e') forming an irradiated combined coating by exposing said combined coating to radiation whose wavelength ranges from about 350 to about 450 nm, through a mask, forming an exposed part of the combined coating which is insoluble in aqueous base and an unexposed part of the combined coating which is soluble in aqueous base;

f') developing said irradiated coating obtained in step e') with an aqueous base developer, wherein said exposed part of the combined coating remains and said unexposed part of the combined coating is removed forming an image in said irradiated combined coating.

In another embodiment of said process of obtaining a negative resist image using a double coating step is one wherein in said first baking step b') this baking temperature may be from about 120° C. to about 150° C., and further wherein the baking time about 6 to about 10 minutes; in yet another embodiment of this baking temperature may be about 130° C. and this baking time is about 8 minutes.

In another embodiment of said process of obtaining a negative resist image using a double coating step is one wherein in said second baking step d') this baking temperature may be from about 120° C. to about 150° C., and further wherein the baking each for about 6 to about 10 minutes; in yet another embodiment this baking temperature may be about 130° C. and this baking time may be about 8 minutes.

In another embodiment of process of obtaining a negative resist image using a single double coating step is one wherein in baking step b') said first baking temperature and said second baking temperature may be from about 120° C. to about 150° C., and further wherein each for about 6 to about 10 minutes; in yet another embodiment of this step the first baking and the second baking may be about 130° C. for about 8 minutes In on embodiment of the above negative imaging single coat process is one wherein the radiation employed in step e') ranges from about 360 nm to about 440 nm.

In on embodiment of the above negative imaging single coat process is one wherein the radiation employed in step e') ranges from about 400 nm to about 440 nm.

The desired polymer of the current disclosure, as well as the novel composition made therefrom, are capable of being solubilized in a suitable developer, prior to being photocured. Typical developers include aqueous alkaline developers including hydroxides, for example tetra ($C_1$-$C_4$ alkyl) ammonium hydroxide, choline hydroxide, lithium hydroxide, sodium hydroxide, or potassium hydroxide, carbonates, bicarbonates, amines and other basic materials. In some cases, and some applications, solvent developers well known in the industry may be used.

The currently disclosed novel composition may further contain polymers useful for their particular properties. For example, polymers with high acid values can be added to aid in the development stage as well as the stripping stage, such as, styrene-co-maleic anhydride-half ester, wherein the ester group may impart certain properties to the novel composition.

Silicon-based materials, capable of reacting with photogenerated free radicals may also be used. These materials include, for example, silsesquioxane full or partial cage materials, as well as ladder materials, which can be included to impart improved toughness, thermal stability and other desirable properties to the novel composition and the final relief image. Acrylates, methacrylates, and vinyl groups may be attached to the silicon material to impart curability. An example is octa-acrylo-silsesquioxane type of materials.

The current application further discloses methods of forming negative relief images. The novel compositions of the current disclosure are coated onto a chosen substrate and dried. The thus created film is then imagewise exposed through a negative mask using actinic radiation which output contains wavelengths suitable to generate free radicals. The patterns that are exposed to the radiation cure or harden. Developer is next applied to the film, and the areas which were not exposed to radiation are solubilized and removed from the substrate.

Coating can be accomplished by any of a number of coating methods, such as, for example, spin coating, slot coating, dip coating, curtain coating, roller coating, wire coating or other known methods. The thus applied coatings are dried of their solvent, to less than 5% solvent. Drying may be performed by hot plate heating, convection, infrared or other known methods for removing solvent from a coated film. In many thick film applications, imagewise exposure energies of less than 1000 mW at wavelengths greater than 300 nm are needed, such as 365 nm, 405 nm, 436 nm and broad-band. After exposure, an appropriate developer is applied to the film, such as 0.25N tetrabutylammonium hydroxide. The developer may be applied by spin coating, dipping, spraying or soaking, and may be about room temperature or may be heated depending on the solubility of the unexposed, as well as the exposed, photoresist in the developer. Typical applications for thick film photoresists require 3/1 aspect ratio, wherein the photoresist at 30-60 microns thicknesses create holes and trenches which are 15-70 microns wide.

After removing the unexposed areas, patterns have been created in the film with the surface of the substrate now capable of further processing, such as, for example, electroplating metal into the relief areas, creating metal lines, bumps, trenches and other structures. The surface which has now been exposed may be subjected to etching of materials on the substrate. After etching, electroplating or other processing, the negative photoresist is removed or stripped, expect in those cases where the negative photoresist is designed to be a permanent material such as a permanent dielectric. Both electroplating and etching processes are well known in the art. Stripping solutions are generally strongly alkaline solutions and are generally heated above 100° F. Often the photoresist is cured to well that the photoresist does not dissolve on the stripping solution, but swells and is removed as a gel.

The current inventive formulation shows unexpectedly high compatibility with electroplating solution for copper. In this respect, the current novel composition can impart after imaging surprisingly good selective electroplating of copper pillars having a diameter ranging from about 20 microns to about 500 microns, having a height raging between about 40 to about 400 microns, preferentially about 80 to about 300 microns without electroplating in areas covered by the imaged photoresist.

Moreover, the novel composition can be imaged, electroplated and stripped when this novel composition is coated on a substrate over a large thickness range from about 5 microns to about 400 microns. Concurrently, as discussed above, these novel compositions are especially useful for Ultra thick applications where features such as pillars are produced with high aspect ratios where the initial film thickness ranges from about 40 microns to about 400 microns, preferentially from about 80 microns to about 300 microns. It was found that when patterned the novel photoresist can undergo the electroplating of the uncoated copper pillars without delamination of the areas protected from electroplating by the patterned novel photoresist, thus ensuring that no undesirable electroplating occurs in these areas.

It was found that after electroplating these copper pillars, the areas protected by the inventive resist could easily be stripped using conventional strippers such as those based upon TMAH and an organic solvent such as DMSO, N-methyl pyrrolidone, 2-amino ethanol and the like, or mixtures of such organic solvent and surfactants using conventional conditions. A non-limiting example of such a stripper and stripping process is a stripping process using RBV-788C stripper (Vision Link Corp). employed at 70° C. for 30-90 min. In our experiments as described in the Examples section we used such a stripper and stripping process to strip off a pattered photoresist after processing.

EXAMPLES

Reference will now be made to more specific embodiments of the present disclosure and experimental results that provide support for such embodiments. However, Applicants note that the disclosure below is for illustrative purposes only and is not intended to limit the scope of the claimed subject matter in any way.

Preparation of Testing Solutions for Examples

Table 1 gives a listing of the Chemicals and their suppliers used in the formulation of the Examples.

All solution where prepared by admixing the polymer, Poly[methacrylic acid-co-benzyl methacrylate-co-tricyclo (5.2.1.0/2.6) decyl methacrylate-co-2-hydroxypropyl methacrylate (MIPHOTO CPR 215)(structure (31) gives the mole % composition of each repeat unit) with the other components, (e.g. photoinitiators, crosslinkers and the like) in the spin casting solvent PGMEA (amount of PGMEA used for these solutions was ~16 mL), as designated in the following Tables of Formulations. This admixture was mixed for 2 days and then filtered.

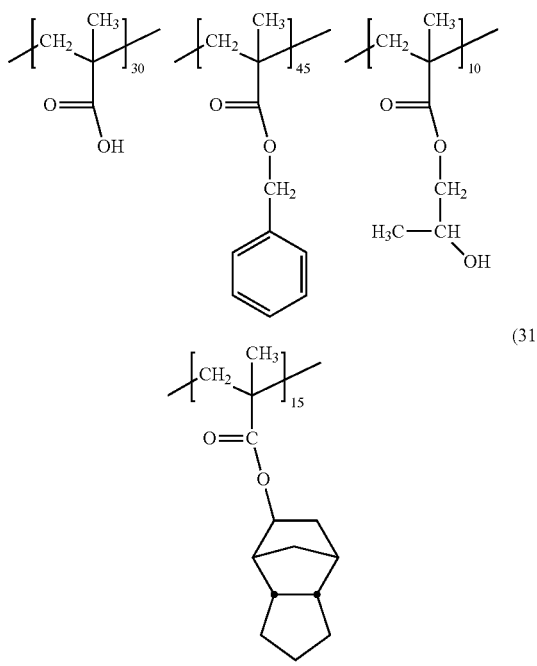

(31)

Photolithographic Imaging

Table 2 gives a listing of photo-lithographic tools and their suppliers, employed in the imaging of the Examples. Typically after coating on a substrate and baking the resultant resist coating was exposed at 1000-4000 mJ/cm$^2$ and the exposed coating was developed on a spin coater using 0.26 N tetramethylammonium hydroxide (TMAH).

Table 3 gives a listing of post-imaging solutions and their supplier used in the processing of resist during plating after exposure and development and during stripping.

Table 4 gives a listing of different tools related to the processing and evaluation of lithographic experiments.

TABLE 1

| Chemicals | | |
|---|---|---|
| Component | Name | Manufacturer |
| MIPHOTO CPR 215 | Poly[methacrylic acid-co-benzyl methacrylate-co-tricyclo(5.2.1.0/2.6) decyl methacrylate-co-2-hydroxypropyl methacrylate | Miwon Commercial Co., Ltd. Miwon Bldg, 464 Anyang-ro, Manan-gu, Anyang-si, Gyeonggi-do, 430-806, Korea |
| Irgacure ® 819 | Bis(2,4,6-trimethylbenzoyl)-phenylphosphineoxide | BASF Japan Ltd. Roppongi Hills Mori Tower 21F 6-10-1 Roppongi, Minato-ku Tokyo 106-6121, Japan |
| Irgacure ® OXE01 | 1,2-Octanedione, 1-[4-(phenylthio)phenyl]-, 2-(O-benzoyloxime) | |
| Irgacure ® OXE-02 | Ethanone, 1-[9-ethyl-6-(2-methylbenzoyl)-9H-carbazol-3-yl]-, 1-(O-acetyloxime) | |
| Lignostab ® 1198 | 4-Hydroxy-2,2,6,6-tetramethylpiperidinoxyl | |
| NPG | Neopentyl Glycol Dimethacrylate | Shin-Nakamura Chemical Co., Ltd 687 Arimoto, Wakayama, 640-8390, Japan |
| SR-268 | Tetraethylene Glycol Diacrylate | ARKEMA K.K. Technical Center 1F, Yokohama Business Park, 134 Godo-cho, Hodogaya-ku, Yokohama-shi, Kanagawa, 240-0005, Japan |
| SR-492 | Propoxylated (3) Trimethylolpropane Triacrylate | |
| A-DCP | Tricyclodecane dimethanol diacrylate | Shin-Nakamura Chemical Co Ltd, 687 Arimoto, Wakayama, 640-8390, JAPAN |
| Megafac ® R2011 | Fluorosilicon modified nonionic surfactant | DIC Corporation DIC Building, 7-20, Nihonbashi 3-chome, Chuo-ku, Tokyo 103-8233, Japan |
| TPPA | α,α-Bis(4-hydroxyphenyl)-4-(4-hydroxy-α,α-dimethylbenzyl)ethylbenzene | Honshu Chemical Chemical Co, Ltd, Yaesu-Daibiru Bldg., 1-1, Kyobashi 1-chome, Chuo-ku, Tokyo 104-0031, Japan |
| PGMEA | Propylene glycol methyl ether acetate | DAICEL CORPORATION 2-18-1, Konan, Minato-ku, Tokyo 108-8230, Japan |

TABLE 2

| Lithographic Tool | | |
|---|---|---|
| | Name | Manufacturer |
| Coater/Developer | CLEAN TRACK MARK 8 | Tokyo Electron Limited Akasaka Biz Tower, 3-1 Akasaka 5-chome, Minato-ku, Tokyo 107-6325, Japan |

TABLE 2-continued

Lithographic Tool-

| | Name | Manufacturer |
|---|---|---|
| FT Measurement | Foothill KT-22 | Foothill Instruments, LLC San Juan, PR 00918 USA |
| Stepper | PPS-8300 | ORC MANUFACTURING CO., LTD. 3-9-6 Oyamagaoka, Machida-shi, Tokyo 194-0295, Japan |
| De-scum Process | NE-5000N | ULVAC, Inc. 2500 Hagisono, Chigasaki, Kanagawa 253-8543, Japan |
| Scanning Electron Microscope | S-4700 | Hitachi High-Technologies Corporation 24-14, Nishi-Shimbashi 1-chome, Minato-ku, Tokyo 105-8717, Japan |

TABLE 3

Post Imaging Chemicals-

| | Name | Manufacturer |
|---|---|---|
| Plating solution | MICROFAB® SC-50 | MacDermid Enthone Japan Ltd. 480-28 Higashitoyoda, Hiratsuka City, 254-0082, Japan |
| Stripping Solution | RBV-788C stripper | Vision Link Corp. 1-1-40-203 Suehirocho, Tsurumi, Yokohama, Kanagawa, 230-0045, Japan |

TABLE 4

Related Tool-

| | Name | Manufacturer |
|---|---|---|
| Coater/ Developer | CLEAN TRACK MARK 8 | Tokyo Electron Limited Akasaka Biz Tower, 3-1 Akasaka 5-chome, Minato-ku, Tokyo 107-6325, Japan |
| FT Measurement | Foothill KT-22 | Foothill Instruments, LLC San Juan, PR 00918 USA |
| Stepper | PPS-8300 | ORC MANUFACTURING CO., LTD. 3-9-6 Oyamagaoka, Machida-shi, Tokyo 194-0295, Japan |
| De-scum Process | NE-5000N | ULVAC, Inc. 2500 Hagisono, Chigasaki, Kanagawa 253-8543, Japan |
| Scanning Electron Microscope | S-4700 | Hitachi High-Technologies Corporation 24-14, Nishi-Shimbashi 1-chome, Minato-ku, Tokyo 105-8717, Japan |

Tables 5 to 10 summarize the lithographic exposures and the post processing done on the resultant images.

The photoresist was coated on a copper seed 8 inch silicon wafer, followed by drying on a hot plate at 130° C. for 8 min, this process is repeated once again to obtain a coating with a film thickness of 250 microns. The film coating was exposed with ORC PPS-8300 stepper at energy from 1000-4000 mJ/cm2. The development was carried out with 0.26N aqueous solution of tetramethylammonium hydroxide. The film thickness before and after development were measured with a Foothill KT-22 film thickness measurement tool and film thickness loss was calculated. In order to improve the hydrophilicity to the plating solution, De-scum process was performed with ULVAC NE-5000N under the conditions 266 Pa of He Pressure, 10 Pa of Process Pressure, 20 sec of Process Time, 100SCCM of O2 gas and 1000 W of Antenna Power. Confirmed whether cracks were visually observed after De-Scum process. The compatibility study between the photoresist and electrolyte (MICROFAB® SC-50) was carried out to ensure that the electrolyte does not attack the photoresist under chemical and electrochemical condition. Plating Cu bumps was performed from a beaker with 2 cm×2 cm patterned wafer at current density of 4 Amps/decimeter2 (ASD) for 150 min at 30° C. Plated Cu structures varied in thickness with current density and plating time. After plating, the photoresist was removed with RBV-788C stripper at 70° C. Plated Cu structures and cross sections of the resist sidewall profiles were evaluated by scanning electron micrographs (SEM) using Hitachi S-4700 electron microscopes.

TABLE 5

Formulations Containing Different Levels of Photoinitiators and Photoinitiator Type

| Component type | Component name | Comp EX. 1 Wt. % | EX 1 Wt. % | EX. 2 Wt. % | EX. 3 Wt. % | EX. 4 Wt. % | Comp EX. 2 Wt. % | Comp. EX. 3 Wt. % |
|---|---|---|---|---|---|---|---|---|
| Resist polymer a) (17) | MIPHOTO CPR2 15 | 32.91 | 34.03 | 33.7 | 33.38 | 33.07 | 33.98 | 33.98 |
| crosslinker c) (6) | SR-268 | 3.29 | 3.4 | 3.37 | 3.34 | 3.31 | 3.4 | 3.4 |
| crosslinker (5) | NPG | 13.16 | 13.61 | 13.48 | 13.35 | 13.23 | 13.59 | 13.59 |
| crosslinker (7) | SR-492 | 16.46 | 17.02 | 16.58 | 16.69 | 16.53 | 16.99 | 16.99 |
| | wt. Ratio crosslinker/Polymer | 1 | 1 | 1 | 1 | 1 | 1 | 1 |
| Initiator b) | Irgacure ® 819 | 0.66 | 1.36 | 2.02 | 2.67 | 3.31 | — | — |
| | wt. Ratio total crosslinker/Initiator) | 49.9 | 25.02 | 16.68 | 12.50 | 9.99 | 24.99 | 24.99 |
| Initiator b) | Irgacure ® OXE01 | — | — | — | — | — | 1.36 | — |
| Initiator b) | Irgacure ® OXE-02 | — | — | — | — | — | — | 1.36 |
| Radical Inhibitor d) | Lignostab ® 1198 | 0.33 | 0.34 | 0.34 | 0.34 | 0.34 | 0.34 | 0.34 |
| Surfactant e) | Megafac ® R2011 | 0.23 | 0.24 | 0.24 | 0.23 | 0.23 | 0.24 | 0.24 |
| Solvent g) | PGMEA | 32.96 | 30.00 | 30.27 | 30 | 29.98 | 30.1 | 30.1 |
| | Total Wt. | 100 | 100 | 100 | 100 | 100 | 100 | 100 |

TABLE 6

Evaluation of Formulations Containing Different Levels of Photoinitiators and Photoinitiator Type

| | Comp EX. 1 | EX. 1 | EX. 2 | EX. 3 | EX. 4 | Comp. EX. 2 | Comp. EX. 3 |
|---|---|---|---|---|---|---|---|
| Surface Quality | Dry | Dry | Dry | Dry | Dry | Dry | Dry |
| Energy(mJ/cm$^2$) | 3000 | 3000 | 3000 | 3000 | 3000 | 3000 | 3000 |
| Film Thickness Loss (%) | >10 | <5 | <5 | <5 | <5 | <5 | <5 |
| Profile | Straight | Straight | Slight reentrant profile | Slight reentrant profile | Slight reentrant profile | Straight | Straight |
| Adhesion | Good | Good | Good | Good | Good | Bad | Bad |
| Resolution | >4 | >4 | >4 | >4 | >4 | >4 | >4 |
| After Plasma De-scum | — | OK | — | — | — | -NA | -NA |
| Compatibility with Cu plating | — | Yes | — | — | — | -NA | NA- |
| Stripping Property | pass | pass | pass - | pass - | pass - | -NA | -NA |

Pass = stripping time between 30 and 90 minutes

TABLE 7

Formulations Containing Radical Inhibitors

| | Component | EX. 1 Wt. % | EX. 5 Wt. % | EX. 6 Wt. % | EX. 7 Wt. % |
|---|---|---|---|---|---|
| Resist polymer a) (31) | MIPHOTO CPR 215 | 34.03 | 34.1 | 34.15 | 34.48 |
| Crosslinker c) (6) | SR-268 | 3.4 | 3.41 | 3.41 | 3.45 |
| Crosslinker c) (5) | NPG | 13.61 | 13.64 | 13.66 | 13.79 |
| Crosslinker c) (7) | SR-492 | 17.02 | 17.05 | 17.07 | 17.24 |
| wt. Ratio crosslinker/polymer c)/a) | | 1 | 1 | 1 | 1 |
| Initiator b) | Irgacure ® 819 | 1.36 | 1.36 | 1.37 | 1.38 |
| wt. Ratio crosslinker/initiator c)/b) | | 25.02 | 25.07 | 24.91 | 24.98 |
| Radical Inhibitor d) | Lignostab ® 1198 | 0.34 | 0.2 | 0.1 | 0.07 |
| Surfactant e) | Megafac ® R2011 | 0.24 | 0.24 | 0.24 | 0.24 |
| Solvent g) | PGMEA | 30 | 30.24 | 30 | 29.35 |
| Total Wt. | | 100 | 100 | 100 | 100 |

TABLE 8

Evaluation of Formulations Containing Radical Inhibitors

| | EX. 1 | EX. 5 | EX. 6 | EX. 7 |
|---|---|---|---|---|
| Surface Quality | Dry | Dry | Dry | Dry |
| Energy (mJ/cm$^2$) | 3000 | 2000 | 1700 | 1600 |
| Film Thickness Loss (%) | <5 | <5 | <5 | <5 |
| Profile | Straight | Straight | Straight | Straight |
| Adhesion | Good | Good | Good | Good |
| Resolution microns | >4 | >4 | >4 | >4 |
| After De-scum | OK | OK | OK | OK |
| Compatibility with Cu plating | Yes | Yes | Yes | Yes |
| Stripping Property | pass | pass- | pass- | pass |

Pass = stripping time between 30 and 90 minutes

TABLE 9

Formulations Containing Different wt. % Total Loading

| Component type | Component | EX 7 Wt. % | EX. 8 Wt. % | EX. 9 Wt. % | EX 10 Wt. % | Conp EX 4 Wt. % | Comp EX 5 Wt. % | Comp EX 6 Wt. % | Comp. EX. 7 Wt. % | Comp. EX. 8 Wt. % | Comp. EX. 9 Wt. % |
|---|---|---|---|---|---|---|---|---|---|---|---|
| Resist polymer a) (16) | MIPHOTO CPR 215 | 34.48 | 34.43 | 35.15 | 30.91 | 35.45 | 35.72 | 36.15 | 32.99 | 32.99 | 32.99 |
| b) Photoinitiator | Irgacure ® 819 | 1.38 | 1.38 | 1.41 | 1.37 | 1.42 | 1.43 | 1.45 | 1.32 | 1.32 | 1.32 |
| c) crosslinker (6) | SR-268 | 3.45 | 3.1 | 2.81 | 0 | 2.48 | 2.14 | 1.81 | — | 26.39 | — |
| c) (5) | NPG | 13.79 | 12.39 | 11.25 | 0 | 9.93 | 8.57 | 7.23 | 26.39 | | |
| c) (7) | SR-492 | 17.24 | 15.49 | 14.06 | 0 | 12.41 | 10.72 | 9.04 | — | — | 26.39 |
| c) (8) | A-DCP | 0 | 0 | 0 | 27.47 | 0 | 0 | 0 | 0 | 0 | 0 |
| wt. ratio crosslinker/Polymer c)/a) | | 1 | 0.90 | 0.80 | 0.89 | 0.70 | 0.60 | 0.50 | | | |
| Wt. ratio crosslinkder/initiator c)/b) | | 24.99 | 22.45 | 19.94 | 20.05 | 17.48 | 14.99 | 12.47 | 19.99 | 19.99 | 19.99 |
| d) Radical Inhibitor | Lignostab ® 1198 | 0.07 | 0.07 | 0.07 | 0.07 | 0.07 | 0.07 | 0.07 | 0.07 | 0.07 | 0.07 |

TABLE 9-continued

Formulations Containing Different wt. % Total Loading

| Component type | Component | EX 7 Wt. % | EX. 8 Wt. % | EX. 9 Wt. % | EX 10 Wt. % | Conp EX 4 Wt. % | Comp EX 5 Wt. % | Comp EX 6 Wt. % | Comp. EX. 7 Wt. % | Comp. EX. 8 Wt. % | Comp. EX. 9 Wt. % |
|---|---|---|---|---|---|---|---|---|---|---|---|
| f) dissolution promoter | TPPA | 0 | 0 | 0 | 3.43 | 0 | 0 | 0 | 0 | 0 | 0 |
| e) Surfactant | Megafac® R2011 | 0.24 | 0.24 | 0.25 | 0.25 | 0.25 | 0.25 | 0.25 | 0.23 | 0.23 | 0.23 |
| g) Solvent | PGMEA | 29.35 | 32.9 | 35 | 36.5 | 37.99 | 41.1 | 44 | 39 | 39 | 39 |
| | Total Wt. | 100 | 100 | 100 | 100 | 100 | 100 | 100 | 100 | 100 | 100 |

TABLE 10

Evaluation of Formulations Containing Different wt. % Total Loading

| | EX. 7 | EX. 8 | EX. 9 | EX 10 | Comp EX. 4 | Comp EX. 5 | Comp EX. 6 | Comp. EX. 7 | Comp. EX. 8 | Comp. EX. 9 |
|---|---|---|---|---|---|---|---|---|---|---|
| Surface Quality | Dry | Dry | Dry | Dry | Dry | Dry | Dry | Dry | Tacky | Dry |
| Energy (mJ/cm$^2$) | 1600 | 1600 | 1600 | 2000 | 1600 | 1600 | 1600 | 1600 | NA | 1600 |
| Film Thickness Loss (%) | <5 | <5 | <5 | <5 | <5 | <5 | <5 | <5 | NA- | <5 |
| Profile | Straight | Straight | Straight | Straight | Straight | Straight | Straight | Bad, Pronounced Taper | NA- | Straight |
| Adhesion | Good | Good | Good | Good | Good | Good | Good | Good | NA- | Good |
| Resolution:Aspect Ratio | >4 | >4 | >4 | >4 | >4 | >4 | >4 | >4, with very bad Taper | NA- | >2 poor resolution |
| After Plasma De-scum | OK | OK | OK | OK | Crack | Crack | Crack | NA- | NA- | NA |
| Compatibility with Cu plating | Yes | Yes | Yes | Yes | Yes | Yes | Yes | NA- | NA- | NA |
| Stripping Property | pass | pass | pass | Pass | pass | pass | pass | NA- | NA- | NA- |

Pass = stripping time between 30 and 90 minutes;
OK = no cracks after plasma descum;
Crack = pronounced level of cracking observed after descum,
NA = not done because of poor property Tables 5 shows resist formulation in which the amount and nature of the radical photoinitator is varied. Specifically, comparative examples 1 (comp. EX. 1), Examples 1 to 4 show formulation in which the ratio of total wt. of crosslinker component over the photoinitiator amount it is varied, but all employ an arylacyl phosphine intitator type, Irgacure® 819, having a broad absorption between about 360 nm to about 440 nm. As can be seen in Table 6, the formulations having a lower ratio of these components unexpectedly gave good characteristic for all screening categories including profiles where acceptable results, namely, straight or slight reentrant profile were observed. Com EX. 1 which had a high ratio of 49.9, although it passed most screening categories, failed to give good resistance to erosion of crosslinked areas giving greater than 10% erosion of film thickness during development with 0.26 N TMAH. Comp EX. 2 and Comp EX 3 show the effect of using radical photoinitiators which have poor or no absorbance at g-line and i-line, formulations containing these photoinitiators suffered adhesion loss during development. This profound adhesion loss prevented these materials from being further evaluated for plasma descuming, compatibility with Cu plating and stripping properties. Similarly, Table 7 shows different formulations (EX. 1, EX. 5, EX. 6, and EX. 7,) falling within the inventive composition. These formulations, as shown in Table 8, showed the same unexpected good properties in all screening criteria.

Table 9 shows formulations having either different ratios of crosslinker to polymer ranging from 1 to 0.5 (EX. 7, EX. 8, EX. 9, EX. 10 Comp EX. 4, Comp EX. 5, Comp EX. 6, and Comp. EX. 7, Comp EX. 8 and Comp Ex 9) and formulations in which one of the components of the crosslinker component is omitted. Table 10, summarizing the results and shows that when using a ratio of crosslinker of 0.70 or lower, this resulted in extensive cracking during plasma descumming. Unexpectedly, in this Table only the formulations containing a higher wt. ratio of total wt. of crosslinker to total wt. of polymer, (EX 7, EX 8, EX 9, EX 10), could pass all screening criteria. Apart from this ratio, the nature of the crosslinker component is also of importance in maintaining desirable properties. For instance, using either crosslinker (5), (6) or (7) as a single crosslinking component, let to a dramatic deterioration of properties (Comp EX. 7, Comp EX. 8, Comp EX. 9). However, crosslinker (8) could be used as a single crosslinking component without manifestation of any deleterious behavior.

We claim:

1. negative working, aqueous base developable, photosensitive photoresist composition comprising:

a) a polymer containing the four repeat units of structures (1), (2), (3), and (4), but no other types of repeat units

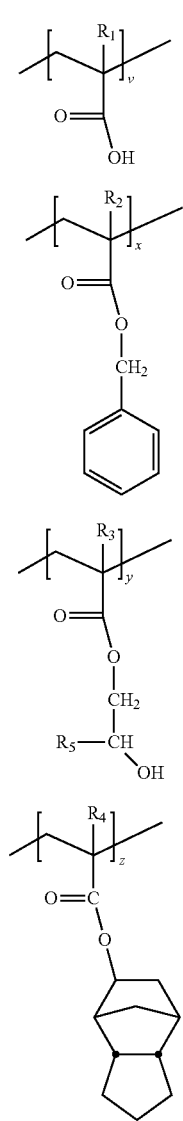

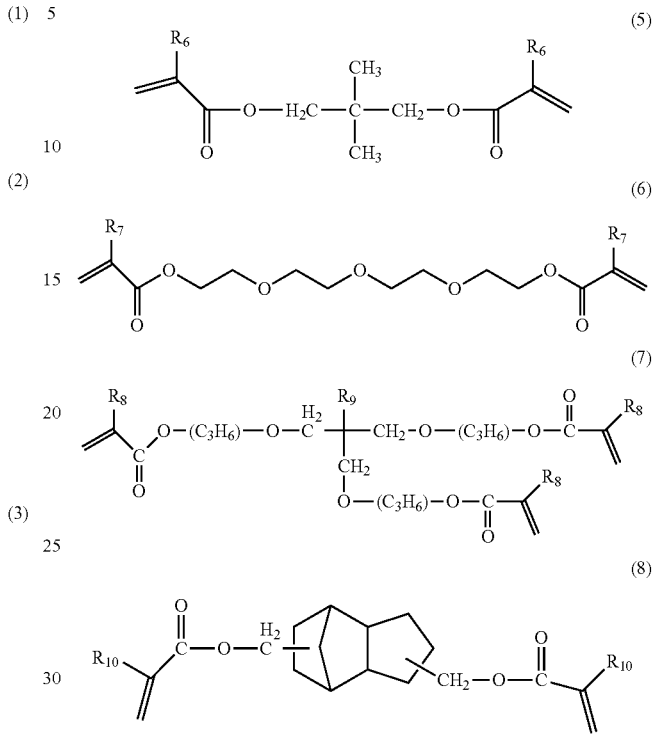

wherein, v, x, y and z, respectively, represent the mole % of each repeat unit of structures (1), (2), (3) and (4) in the polymer, wherein, v ranges from 20 to 40 mole %, x ranges from 20 to 60 mole %, y ranges from 5 to 20 mole %, z ranges from 3 to 20 mole % wherein, $R_1$, $R_2$, $R_3$, and $R_4$, are independently selected from the group consisting of H and $CH_3$, and $R_5$ is a Ci to C4 alkyl moiety, wherein the summation of the mole % v, x, y and z, must add up to 100 mole %;

b) a radical photo-initiator component, which is comprised of at least one radical photo-initiator which is activated by a broad absorption of radiation from 360 nm to 440 nm;

c) a crosslinker component selected either from, a mixture of crosslinkers structure (5), (6) and (7), or a single crosslinker of structure (8), wherein, $R_6$, $R_7$, $R_8$, $R_{10}$ are independently selected from H or methyl, and $R_9$ is selected from methyl or ethyl, wherein, the wt. ratio of total wt. of said crosslinker component c) to total wt. of said polymer a), ranges from 0.71 up to 1.2;

wherein, the wt. ratio of total wt. of said crosslinker component c) over total wt. of said radical photo-initiator component b) is from 9 to 40 d) a radical inhibitor component containing at least one radical inhibitor;

e) an optional surfactant component containing at least one surfactant material;

f) an optional dissolution promoter component; and g) a solvent;

wherein, the composition is free of colorants, pigments, lake pigments, organic particles, inorganic particles, metal oxide particles, metal particles, composite oxide particles, metal sulfide particles, metal nitride particles, metal acid nitride particles, inorganic salt particles, organic salt particles, colloidal particles, fibers, oxiranes, oxiranes based crosslinkers, polysiloxane polymers.

2. A negative working, aqueous base developable, photosensitive photoresist composition consisting essentially of:

a) a polymer containing the four repeat units of structures (1), (2), (3), and (4), but no other types of repeat units

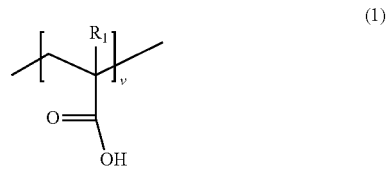

-continued

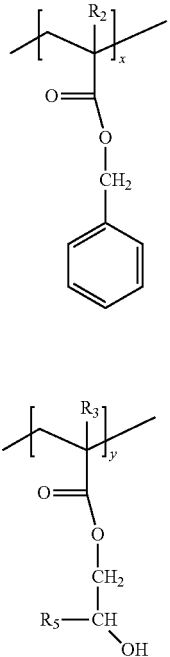

(2)

(3)

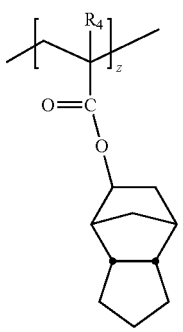

(4)

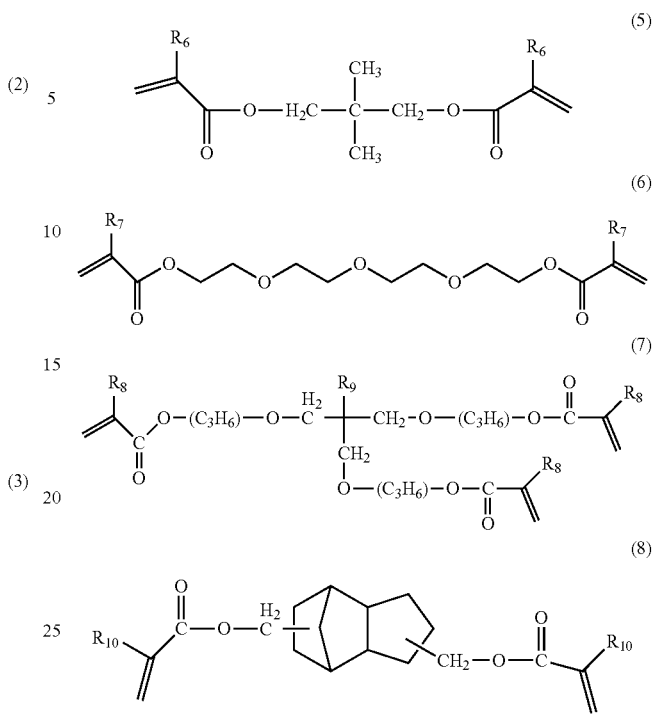

wherein, v, x, y and z, respectively, represent the mole % of each repeat units of structures (1), (2), (3) and (4) in the polymer, wherein, v ranges from 20 to 40 mole %, x ranges from 20 to 60 mole %, y ranges from about 5 to 20 mole %, z ranges from 3 to 20 mole % and, wherein, $R_1$, $R_2$, $R_3$, and $R_4$, are independently selected from the group consisting of H and $CH_3$, and $R_5$ is a $C_1$ to $C_4$ alkyl moiety, and further still, wherein the summation of the mole % v, x, y and z, must add up to 100 mole %;

b) a radical photo-initiator component, which is comprised of at least one radical photo-initiator which is activated by a broad absorption of radiation from 360 nm to 440 nm;

c) a crosslinker component selected either from, a mixture of crosslinkers of structure (5), (6) and (7), or a single crosslinker of structure (8), wherein, $R_6$, $R_7$, $R_8$, $R_{10}$ are independently selected from H or methyl, and $R_9$ is selected from methyl or ethyl, and further wherein, the wt. ratio of total wt. of said crosslinker component c) to total wt. of said polymer a), ranges from 0.71 up to 1.2;

wherein, the wt. ratio of total wt. of said crosslinker component c) over total wt. of said radical photo-initiator component b) is from 9 to 40;

d) a radical inhibitor component containing at least one radical inhibitor;

e) an optional surfactant component containing at least one surfactant material;

f) an optional dissolution promoter component; and g) a solvent.

3. The composition of claim 1, wherein in said polymer, v is 30 mole %, x is 45 mole %, y is 15 mole % and z is 10 mole %.

4. The composition of claim 1, wherein said crosslinker component is said mixture of (5), (6) and (7).

5. The composition of claim 1, wherein said crosslinker component is said single crosslinker (8).

6. The composition of claims 1, wherein the weight ratio of total wt. of said crosslinker component c) to total wt. of polymer a) ranges from 0.75 to 1.2.

7. The composition of claim 1, wherein said weight ratio of total wt. of said crosslinker component c) to total wt. of said polymer component a) is 0.80 to 1.0.

8. The composition of claim 1, wherein said weight ratio of total wt. of said crosslinker component c) to total wt. of said radical photo-initiator component b) which is activated by a broad absorption of radiation is from 9 to 30.

9. The composition of claim 1, wherein said crosslinker component c), is said mixture of crosslinkers (5), (6) and (7); and further wherein (5) ranges from 5 wt. % to 20 wt. %; (6) ranges from 1 wt. % to 10 wt. % and (7) ranges from 5 wt. % to 20 wt. %, of the total wt. of the composition.

10. The composition of claim 1, wherein said crosslinker component c), is the single crosslinker (8), which ranges from 26 wt. % to 56 wt. % of the total wt. of the composition.

11. The composition of claim 1, wherein said radical photo-initiator which is activated by a broad absorption of radiation is one which has a molar absorption of at least 200 AU*L*mole$^{-1}$*cm$^{-1}$ at i-line 364.4 nm; at least 100 AU*L*mole$^{-1}$*cm$^{-1}$ at h-line 404.7 and at least 20 AU*L*mole$^{-1}$*cm$^{-1}$ at g-line 435.8 nm.

12. The composition of claim 1, wherein in said radical photo-initiator component b), which is activated by a broad absorption of radiation is an arylacyl-phosphine oxide photoinitiator component either selected from the group consisting of mono(arylacyl)-phosphine oxides, di(arylacyl)-phosphine oxides, and tri(arylacyl)-phosphine oxides, or is a mixture of these different arylacylphosphine oxide photoinitiators.

13. The composition of claim 1, wherein in said radical photo-initiator component b), which is activated by a broad absorption of radiation is a single arylacyl-phosphine oxide photoinitiator having structure (9) or a mixture of different arylacyl-phosphine oxide photo-initiators having structure (9); wherein Ria, Rib, Ric, Rid, and Rie, are independently selected from H, Cl, or a C-1 to C-8 alkyl and Rif is selected from a C-1 to C-8 alkyloxy moiety, a phenylacyl moiety, a structure (9a), and an aryl having structures (9b), and Rig is a phenylacyl moiety, a structure (9a), or an aryl having structures (9b); wherein Riaa, Riba, Rica, Rida, Riea, Riab, Ribb, Ricb, Ridb, and Rieb are independently selected from H, Cl and a C-1 to C-8 alkyl, and ∿∿∿ represent the attachment point of said phenylacyl of structure (9a), or said phenyl moiety of structure (9b) to the phosphorous in structure (9)

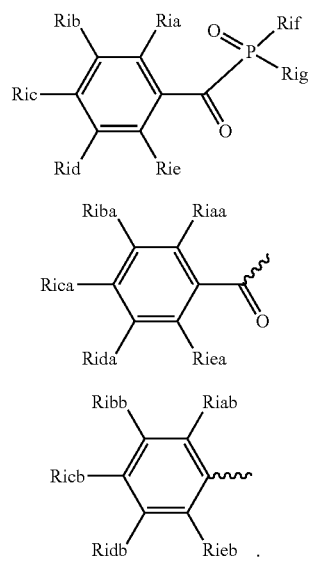

14. The composition of claim 1, wherein said radical inhibitor is a nitroxide having a structure selected from the group consisting of structures (10), (11), (12), (13), (14), (15), and 16, wherein the Ri, are alkyl groups individually selected from methyl, linear alkyl group, having 2 to 18 carbon atoms, branched chain alkyl groups having 2 to 18 carbon atoms, and further wherein Ri can be either the same or different and further wherein these alkyl group may be unsubstituted or substituted from with at least one substituent selected from the group consisting of carboxyl, alkylcarboxyl, hydroxyl, alkyloxy (—OR), cyano, aminocarbonylalkyl (NHCOR), succimido, sulfonic, alkyl sulfonate (—O—SO$_2$—R) and alkyl sulfone (SO$_2$R), wherein R is a linear alkyl, with 1 to 18 carbon atoms, or a branched alkyl substituent with 3 to 18 carbon atoms;

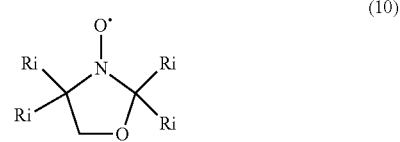

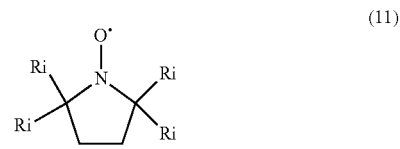

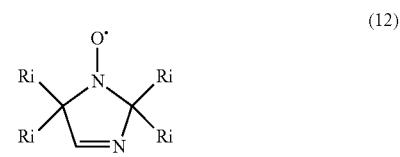

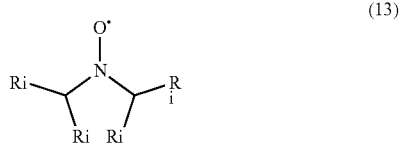

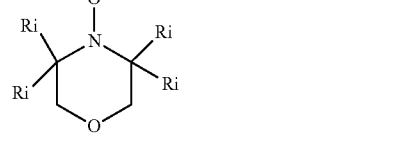

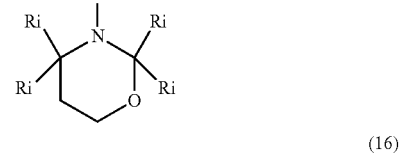

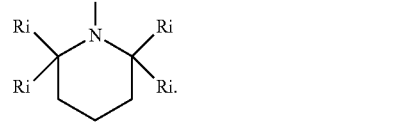

15. The composition of claim 1, wherein the optional dissolution promoter f) is present.

16. The composition of claim 1, wherein the optional dissolution promoter f) is present and is a compound comprising a carboxylic acid group.

17. The composition of claim 1, wherein the optional dissolution promoter f) is present and is a compound comprising, multiple phenol groups.

18. The composition of claim 1, wherein the optional dissolution promoter f) is present, and is compound (18), wherein the linking groups Xp is selected from a —O—, —CH$_2$—, —C(CH$_3$)$_2$—, and —SO$_2$—; Rp1 is hydrogen or an alkyl moiety;

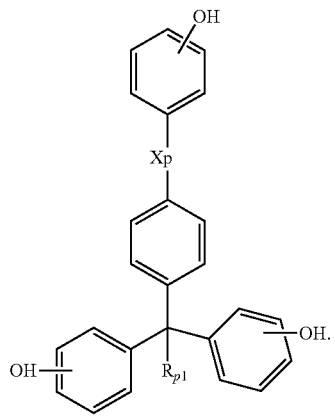

(18)

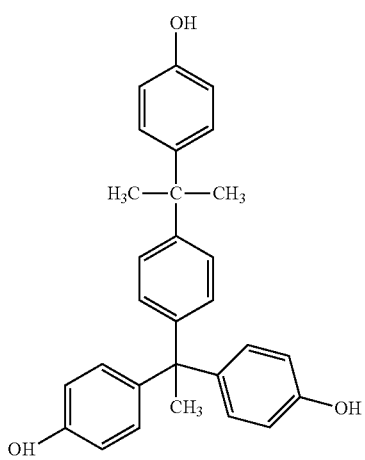

(18b)

19. The composition of claim 1, wherein the optional dissolution promoter f) is present, and is compound (18a), wherein the linking group Xpa is i selected from a —O—, —CH$_2$—, —C(CH$_3$)$_2$—, and —SO$_2$—; Rp1 is hydrogen or an alkyl moiety;

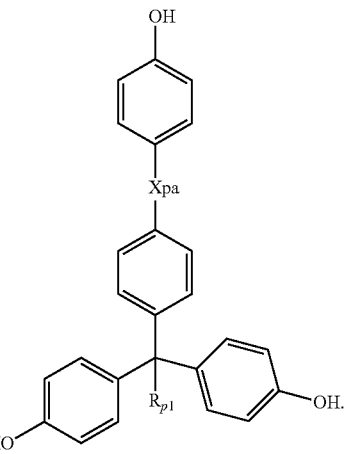

(18a)

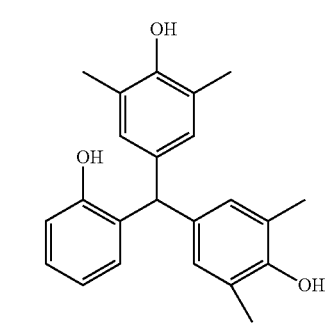

(19a)

20. The composition of claim 1, wherein the optional dissolution promoter group f) is present, and is compound (19); wherein Rp2, Rp3, Rp4, Rp5 are independently selected from hydrogen or an alkyl moiety

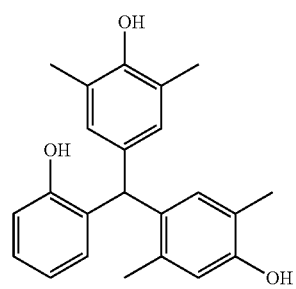

(19b)

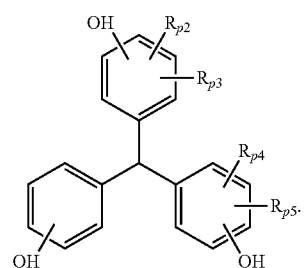

(19)

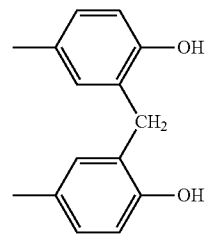

(20)

21. The composition of claim 1, wherein the optional dissolution promoter group f) is present and is selected from compound (18b), (19a), (19b), (20) to (29) and (30);

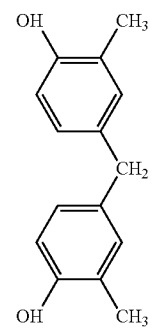

(21)

(22) 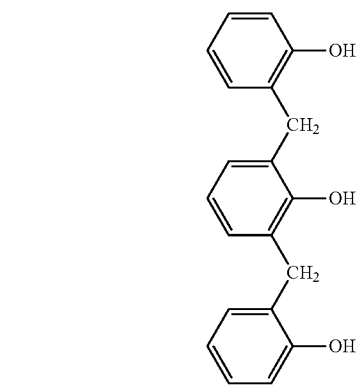
(23) 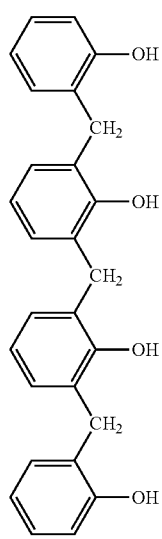
(24) 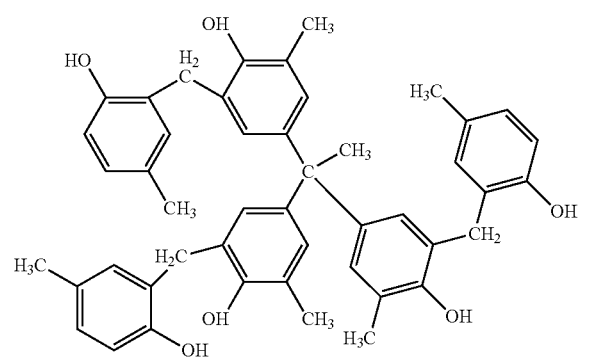
(25) 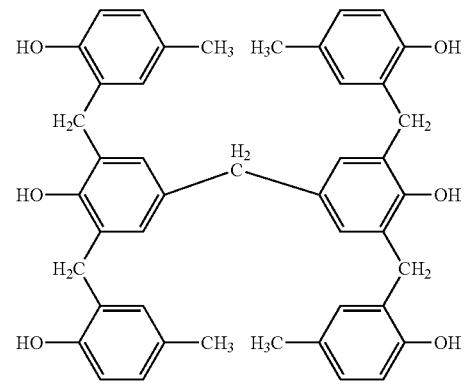
(26) 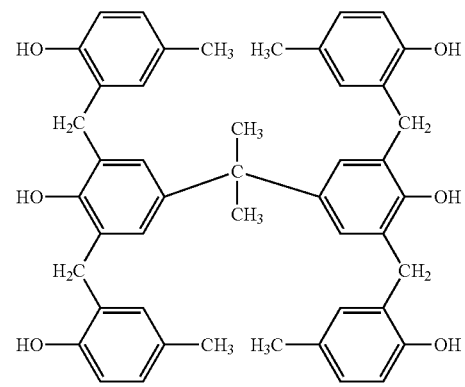
(27) 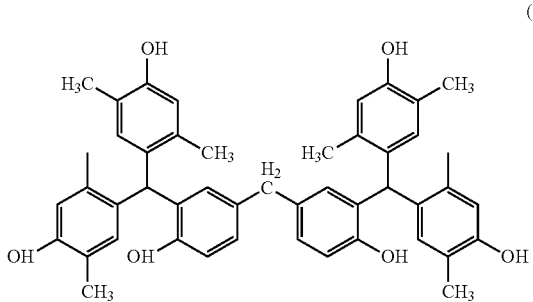
(28) 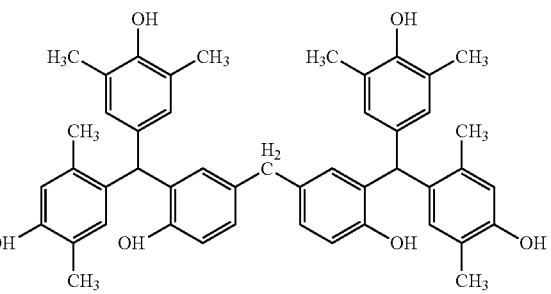

-continued

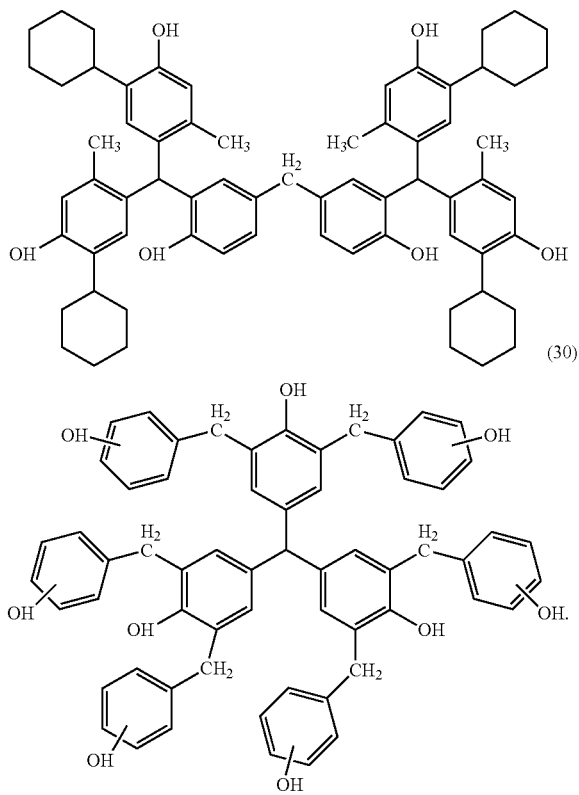

22. A process comprising the steps of;

a') applying a composition of claim 1, on a semiconductor substrate to form a first coating b') a first baking step wherein said first coating is baked at a temperature ranging from 100° C. to 150° C. for 5 to 15 minutes c') applying said composition used in step a') on top of said first coating to form a second coating d') a second baking step wherein said first coating and said second coating are baked at a temperature ranging from 100 to 150° C. for 5 to 15 minutes to form a combined coating;

e') forming an irradiated combined coating by exposing said combined coating to radiation whose wavelength ranges from 350 to 450 nm, through a mask, forming an exposed part of the combined coating which is insoluble in aqueous base and an unexposed part of the combined coating which is soluble in aqueous base; and f') developing said irradiated coating obtained in step e') with an aqueous base developer, wherein said exposed part of the combined coating remains, and said unexposed part of the combined coating is removed forming an image in said irradiated combined coating.

* * * * *